United States Patent
Park

(10) Patent No.: US 11,293,686 B2
(45) Date of Patent: Apr. 5, 2022

(54) TOUCH SENSOR ASSEMBLY AND REFRIGERATOR DOOR INCLUDING A TOUCH SENSOR ASSEMBLY

(71) Applicant: LG ELECTRONICS INC., Seoul (KR)

(72) Inventor: Seungje Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/515,259

(22) Filed: Jul. 18, 2019

(65) Prior Publication Data

US 2020/0041195 A1 Feb. 6, 2020

(30) Foreign Application Priority Data

Jul. 31, 2018 (KR) .......................... 10-2018-0089329

(51) Int. Cl.
| | |
|---|---|
| *F25D 23/02* | (2006.01) |
| *G06F 3/041* | (2006.01) |
| *H03K 17/96* | (2006.01) |
| *F25D 29/00* | (2006.01) |

(52) U.S. Cl.
CPC .......... *F25D 23/028* (2013.01); *G06F 3/0414* (2013.01); *H03K 17/964* (2013.01); *F25D 29/005* (2013.01); *F25D 2400/361* (2013.01)

(58) Field of Classification Search
CPC ............. F25D 23/028; F25D 2400/361; F25D 29/005; F25D 11/00; F25D 23/02; F25D 29/00; G06F 3/0414; G06F 3/04144; H03K 17/964; H03K 17/9643; H03K 2217/96015
See application file for complete search history.

(56) References Cited

U.S. PATENT DOCUMENTS 3,749,235 A * 7/1973 Boursier .............. B65D 85/324
                                                206/782
3,753,843 A * 8/1973 Hutchison ............... E04C 2/365
                                                428/116

(Continued)

FOREIGN PATENT DOCUMENTS

| CN | 1758000 | 4/2006 |
|---|---|---|
| CN | 107782061 | 3/2018 |

(Continued)

OTHER PUBLICATIONS

Korean Office Action dated Aug. 27, 2019.

(Continued)

*Primary Examiner* — David D Davis
(74) *Attorney, Agent, or Firm* — Ked & Associates, LLP

(57) ABSTRACT

A touch sensor assembly may include a touch substrate that is attached to a rear of a front panel on which touch points are displayed, a piezo disc in which a first pole and a second pole are stacked, wherein the first pole faces the touch substrate to contact a rear of the touch substrate; a holder that is configured to support a lateral surface and a rear of the piezo disc to fix the piezo disc to the rear of the touch substrate, and a cover that has a front surface which adheres to the rear of the touch substrate and that includes a concave chamber which is overlapped with the holder. A refrigerator door may include the touch sensor assembly.

13 Claims, 33 Drawing Sheets

(56) References Cited

U.S. PATENT DOCUMENTS

| | | | | |
|---|---|---|---|---|
| 3,982,057 | A | * | 9/1976 | Briggs ................. B32B 3/12 |
| | | | | 428/73 |
| 5,239,152 | A | * | 8/1993 | Caldwell ............ H01H 13/702 |
| | | | | 200/5 R |
| 10,180,748 | B2 | | 1/2019 | Kim et al. |
| 10,429,126 | B2 | | 10/2019 | Park |
| 10,564,769 | B2 | | 2/2020 | Kim et al. |
| 2006/0262549 | A1 | * | 11/2006 | Schmidt ............. G07C 9/0069 |
| | | | | 362/459 |
| 2010/0007531 | A1 | * | 1/2010 | Fluhrer ............. H03K 17/964 |
| | | | | 341/34 |
| 2010/0149000 | A1 | * | 6/2010 | Heimann ........... H03K 17/964 |
| | | | | 341/34 |
| 2012/0106051 | A1 | | 5/2012 | Fluhrer |
| 2014/0009035 | A1 | * | 1/2014 | Toyoda ............. H01L 41/0973 |
| | | | | 310/330 |
| 2015/0091414 | A1 | * | 4/2015 | Lonnberg ............. G06F 3/016 |
| | | | | 310/330 |
| 2015/0185842 | A1 | * | 7/2015 | Picciotto ............ G06F 3/0414 |
| | | | | 345/173 |
| 2015/0286302 | A1 | | 10/2015 | Kim |
| 2016/0105985 | A1 | * | 4/2016 | Wang ................. H03K 17/964 |
| | | | | 361/810 |
| 2016/0117022 | A1 | * | 4/2016 | Kim ..................... F24C 15/02 |
| | | | | 345/174 |
| 2016/0131420 | A1 | * | 5/2016 | Park ................... G06F 3/0412 |
| | | | | 62/56 |
| 2016/0178277 | A1 | * | 6/2016 | Park .................. H03K 17/962 |
| | | | | 345/173 |
| 2016/0186985 | A1 | * | 6/2016 | Kim .................... H03K 17/962 |
| | | | | 362/23.12 |
| 2016/0188025 | A1 | * | 6/2016 | Park ..................... G06F 3/041 |
| | | | | 52/784.15 |
| 2016/0188093 | A1 | * | 6/2016 | Kim .................... G06F 3/0414 |
| | | | | 345/173 |
| 2017/0234609 | A1 | * | 8/2017 | Park .................. H03K 17/9647 |
| | | | | 345/174 |
| 2018/0058747 | A1 | * | 3/2018 | Yang ................... F25D 29/005 |
| 2018/0164945 | A1 | * | 6/2018 | Yang ................... F25D 29/005 |
| 2018/0373375 | A1 | * | 12/2018 | Park ................... H03K 17/964 |

FOREIGN PATENT DOCUMENTS

| | | | | |
|---|---|---|---|---|
| DE | 10 2009 033538 | | 1/2011 | |
| EP | 3 007 361 | | 4/2016 | |
| EP | 3 287 725 | | 2/2018 | |
| GB | 2426344 A | * | 11/2006 | ......... H03K 17/9622 |
| KR | 10-0603733 | | 7/2006 | |
| KR | 10-2014-0063971 | | 5/2014 | |
| KR | 10-2016-0076390 | | 6/2016 | |
| KR | 10-2016-0078194 | | 7/2016 | |
| KR | 10-1826478 | | 2/2018 | |

OTHER PUBLICATIONS

European Search Report dated Jan. 7, 2020 issued in Application No. 19186986.6.

Korean Notice of Allowance dated Feb. 10, 2020 issued in Application No. 10-2018-0089329.

Chinese Office action dated Feb. 7, 2021 (English Translation).

* cited by examiner (a)

(b)

200-1

TOUCH SENSOR ASSEMBLY AND REFRIGERATOR DOOR INCLUDING A TOUCH SENSOR ASSEMBLY

CROSS-REFERENCE TO RELATED APPLICATION(S)

This application claims priority to and the benefit of Korean Patent Application No. 2018-0089329, filed in Korea on Jul. 31, 2018, the disclosure of which is incorporated herein by reference in its entirety.

BACKGROUND

1. Field

A touch sensor assembly and a refrigerator door including the same are disclosed herein.

2. Background

Refrigerators may be classified according to configurations of refrigerator and freezer compartments, such as into top mount refrigerators, which have a freezer compartment above a refrigerator compartment; bottom mount refrigerators, which have a refrigerator compartment above a freezer compartment; and side-by-side refrigerators, which have a refrigerator compartment and a freezer compartment on left and right sides, respectively.

In general, a refrigerator door may be swivably or hingedly installed at a front of a refrigerator and may free a user in a closed state, or a state where the refrigerator door seals a storing room or chamber. Refrigerator doors are closed more often than when they are opened. Accordingly, patterned panels are attached to the front surfaces of refrigerator doors to improve aestheticism, and high-quality materials may be used for the front panels of refrigerator doors.

However, displays showing operation information and buttons used to manipulate the refrigerator may hinder an aestheticism of the front surface of the door and thus the exterior of the refrigerator. Research has been performed into door structures having hidden buttons such that information or a button is displayed only when the user wants the information or button to be displayed.

In addition, demand for home appliances made of metallic materials is increasing. However, it is difficult to apply capacitive touch technology to a door made of metallic materials. It is also difficult to apply resistive touch technology to metallic materials due to their rigidity. With conventional touch sensing technology, hidden buttons are difficult to apply to a panel that is made of metallic materials.

Therefore, there is a need to develop a touch sensor in metallic a panel. The sensor can be applied not only to the front panel of the refrigerator door but also to doors or exteriors of other metallic home appliances to which hidden buttons are applied. Thus, the sensor may be used for various purposes.

A conventional metal touch sensor is disclosed in Korean Patent No. 10-1826478. However, when a metal connector of such a metal touch sensor is exposed to air for a long time, it may become oxidized, which creates problems with an electrical connection of the connector.

When a touch substrate or substrate to which the metal touch sensor (e.g., a piezo disc) is attached adheres to a panel using an adhesive member (e.g., a double-sided tape), the metal touch sensor may be compressed by a device such as a roller with a certain magnitude of force. The metal touch sensor and/or the touch substrate, along with a cover may be deformed or damaged during compression.

When a user applies too much force to the metal touch sensor or touches an area outside the metal touch sensor, the force may be unintentionally delivered to another metal touch sensor. Thus, a product may operate incorrectly. Further, the touch substrate to which the metal touch sensor is attached and a cover display may be manufactured as separate elements. Accordingly, each element must be attached to a panel (e.g., a front surface panel) at separate times, thereby reducing productivity during manufacturing.

The above references are incorporated by reference herein where appropriate for appropriate teachings of additional or alternative details, features and/or technical background.

BRIEF DESCRIPTION OF THE DRAWINGS

Embodiments will be described in detail with reference to the following drawings in which like reference numerals refer to like elements, wherein.

DETAILED DESCRIPTION

Figure 1:
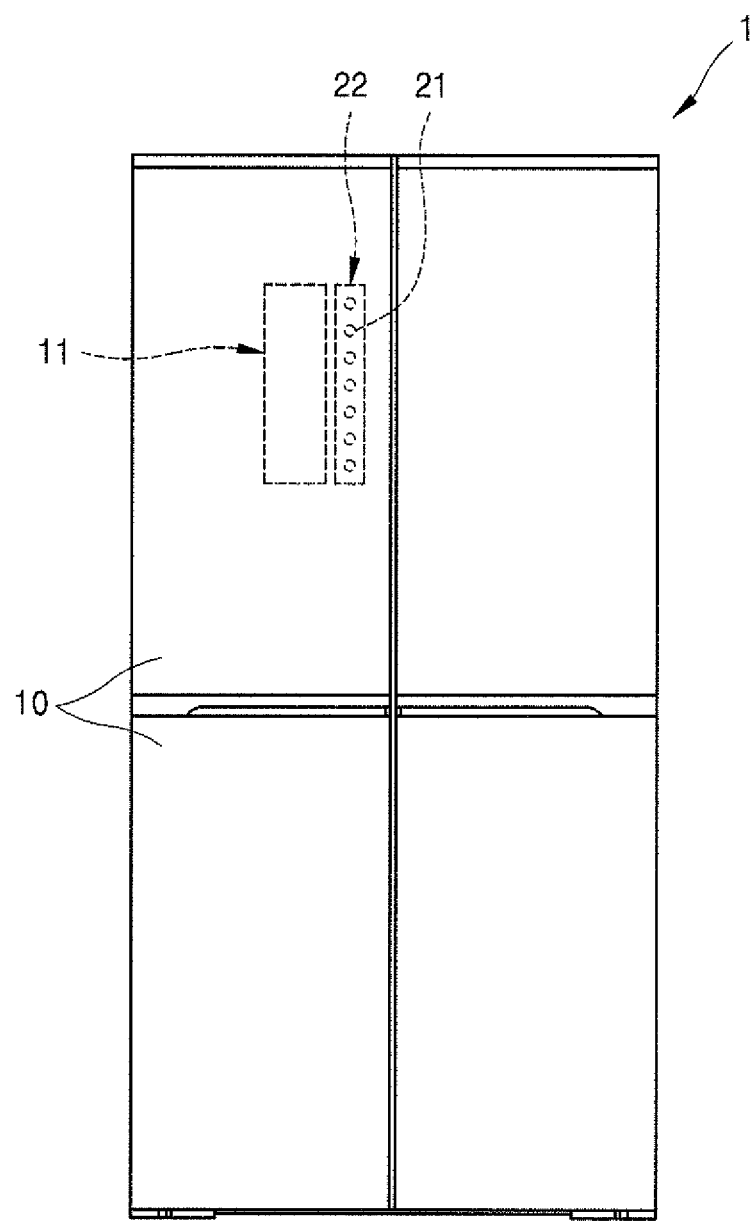
FIG. 1 is a view illustrating a front surface of a refrigerator to which a touch sensor assembly according to an embodiment is applied.
Figure 2:
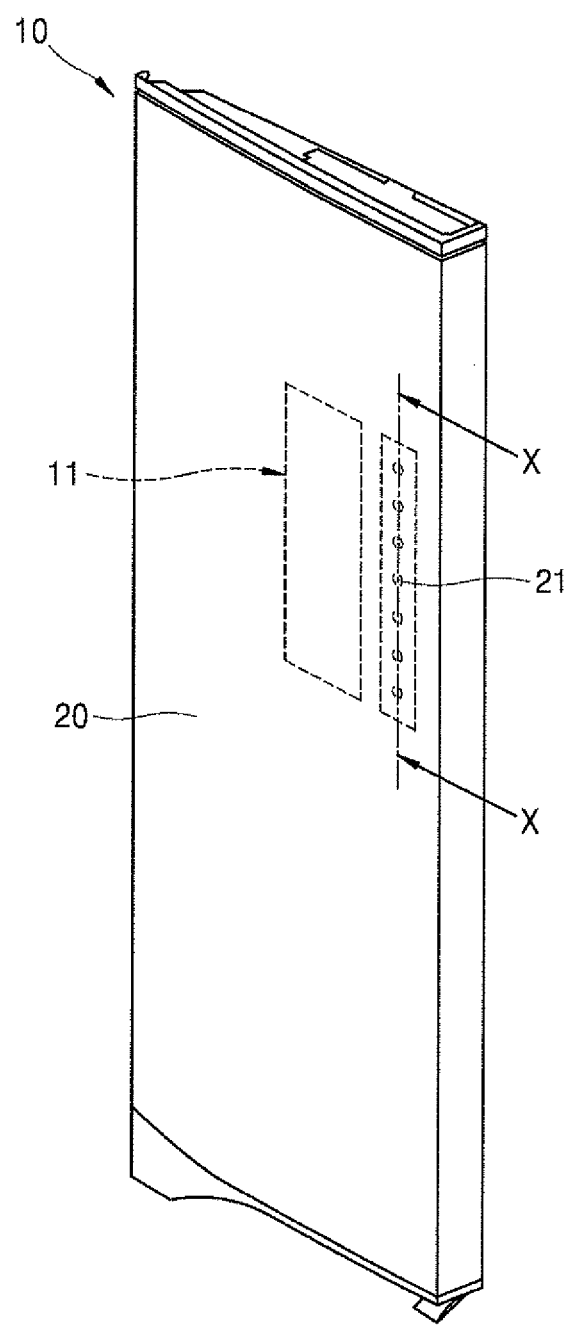
FIG. 2 is a partial perspective view illustrating the refrigerator door in FIG. 1.
Figure 3:
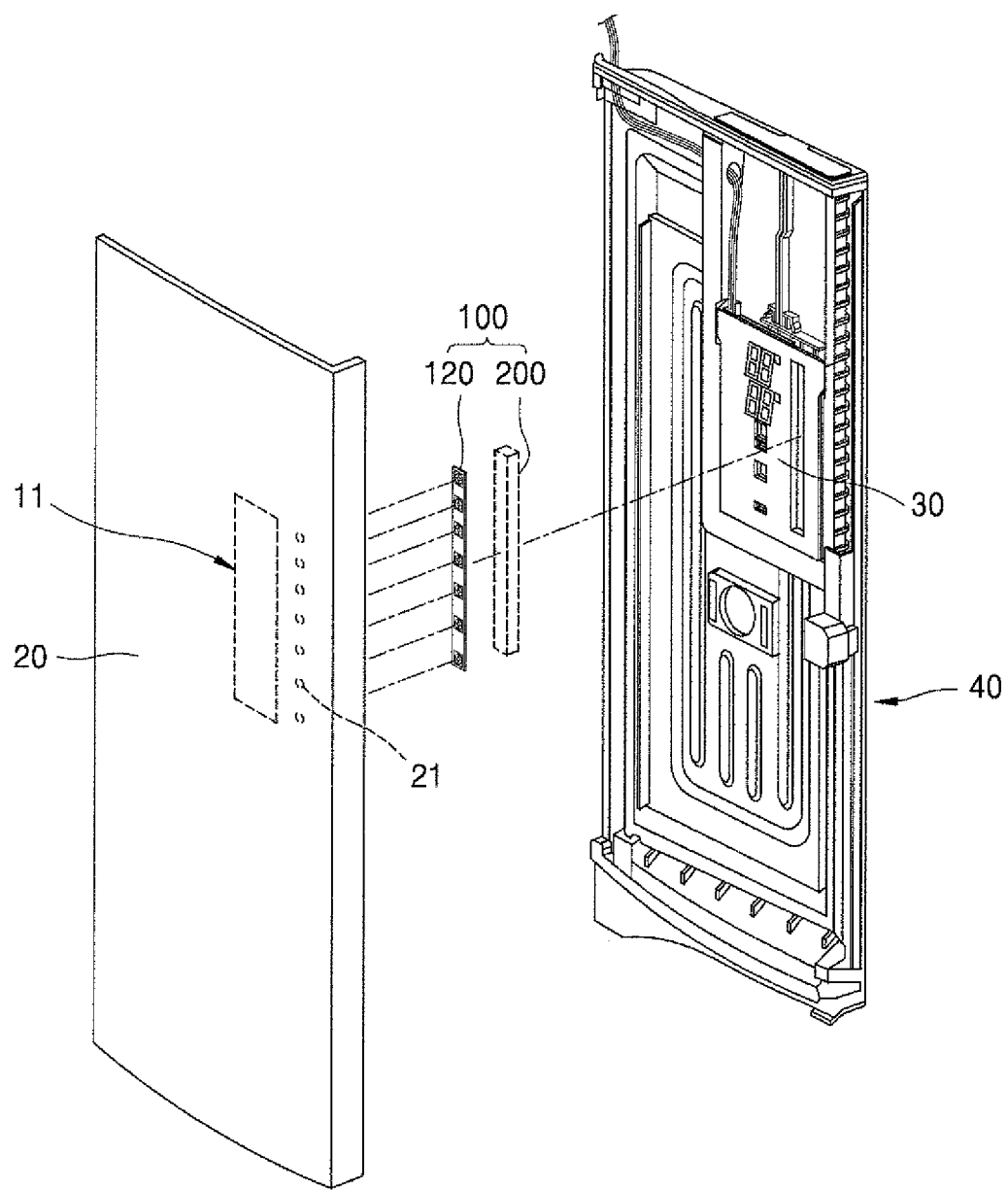
FIG. 3 is a partial exploded perspective view illustrating the refrigerator door in FIG. 1.

Referring to FIGS. 1 to 3, an outer shape of a refrigerator 1 may be defined by a cabinet that provides a storage space, and a refrigerator door or door 10 installed at the cabinet to open and/or close the storage space. The storage space may be partitioned vertically (i.e., into left and right spaces) and/or horizontally (i.e., into upper and lower spaces). A plurality of refrigerator doors 10 that respectively open and close the partitioned storage spaces may be provided in front of the partitioned storage spaces.

The refrigerator doors 10 may slide or rotate to open and close the storage spaces, and may constitute a front exterior appearance of the refrigerator 1 when closed. A display area or window 11 and a touch area or touch input 22 may be provided at a height where the user can easily identify or manipulate the display area 11 and touch area 22, such as a height corresponding to eyes of a user with average height.

The display area 11 may be an area for displaying an operation state of the refrigerator 1. Symbols, numbers, numerals, etc. may be displayed on the display area 11 while light emitted from an inner space of the refrigerator door 10 may be projected onto the display area 11. The user may confirm operation information through the display area 11. When light is not emitted from an inner space of the refrigerator door 10, the display area 11 may not be visible to the user, providing a sleek appearance as if the display area 11 is not on the refrigerator door 10.

The touch area 22 may be an area for touch manipulation so that the user can operate the refrigerator 1 and may be provided near the display area 11. At least one touch point or section 21 may be provided in the touch area 22. When the user presses a touch point 21, an operation corresponding to the touch point 21 may be performed. The at least one touch point 21 may include at least one through-hole. The touch point 21 may be displayed or labeled on the refrigerator door 10 through surface processing (e.g., via a printing process or an etching process) so that the user can identify the locations of the touch point 21.

The touch area 22 may be provided on a refrigerator door 10 different from the refrigerator door 10 with the display area 11, or alternatively may be placed on the same refrigerator door 10 in an area different from the display area 11. As an example, the touch area 22 may be provided on a first (e.g., left or upper) side or region of the refrigerator door 10, and the display area 11 may be provided on a second (e.g., right or lower) side or region of the refrigerator door 10.

Like the display area 11, the touch point 21 may not always be displayed and thus not always identifiable. When light is emitted from the inner space of the refrigerator door 10, the touch point 21 may be illuminated and identified. When light is not emitted from the inner space of the refrigerator door 10, the touch point 21 may not be visible.

A front panel or panel 20 may be manufactured as a metallic plate (e.g., a steel plate or a stainless steel plate). A touch sensor assembly 100 may be fixed onto a rear surface or side of the front panel 20 in a portion or region that corresponds to the touch area 22.

Additionally, a display cover 30 may be installed on an inner or front side of a door liner 40. The display cover 30 may be coupled to (e.g., adhered to) the rear side of the front panel 20 to help secure the touch sensor assembly 100 to the front panel 20. Accordingly, when the front panel 20 and the door liner 40 are coupled, and the touch sensor assembly 100 is provided between the front panel 20 and the door liner 40 and fixed onto the rear side of the front panel 20, the display cover 30 may support and press forward a rear surface or side of the touch sensor assembly 100. A front surface of the touch sensor assembly 100 may thus closely contact the rear surface of the front panel 20 and be supported toward the front panel 20.

Figure 4:
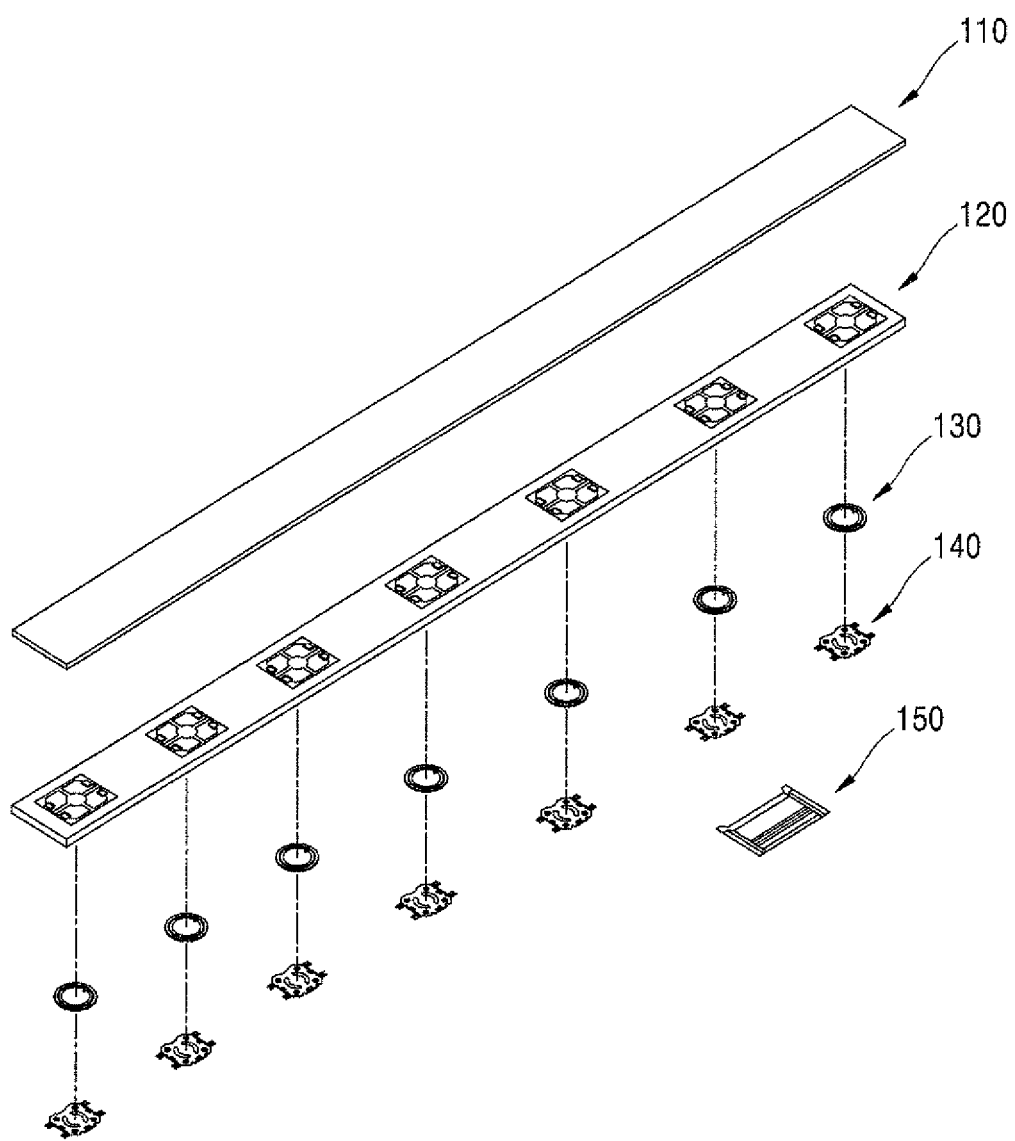
FIG. 4 is an exploded perspective view illustrating the touch sensor assembly in FIG. 3.
Figure 9:
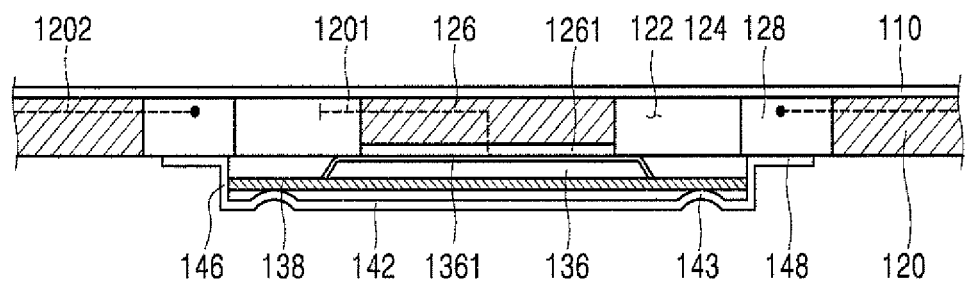
FIG. 9 is a sectional view of the door cut along line X-X in FIG. 2 in the state in which some elements of the touch sensor assembly in FIG. 4 are assembled.

Referring to FIGS. 3, 4 and 9, the touch sensor assembly 100 may include a touch substrate or substrate 120, at least one piezo disc 130, at least one holder 140, and a wafer assembly or connector 150. The touch sensor assembly 100 may further include a first adhesive member or layer 110. The touch substrate 120 may be manufactured as a printed circuit board (PCB) that has a predetermined thickness and may also be referred to as a touch PCB. The first adhesive member 110 may be a double-sided tape to adhere to a front surface of the touch substrate 120, i.e., a side that opposes a surface on which the piezo disc 130 is placed, and to adhere to a rear surface of the front panel 20. The front surface of the touch substrate 120 may therefore adhere to the rear surface of the front panel 20 via the first adhesive member 110.

A second adhesive member 190 may adhere to the rear surface of the touch substrate 120. The second adhesive member 190 may be a very thin layer or coating, and may seal the piezo disc 130 and the holder 140 to be watertight or waterproof.

The touch substrate 120 may be provided at a position corresponding to the touch area 22 and may be configured to correspond to the at least one touch point 21 displayed on the front panel 20. A plurality of touch points 21 may be linearly spaced apart from each other in the touch area 22 on the front panel 20. Accordingly, the touch area 22 may have a shape of a long rectangle, and the touch substrate 120 may also have a shape of a long rectangle. However, the shapes of the touch area 22 and the touch substrate 120 are not limited to long rectangle shapes. The plurality of touch points 21 may be spaced apart in various configurations, and the touch area 22 and the touch substrate 120 may have different shapes that surround the plurality of touch points 21.

Figure 5:
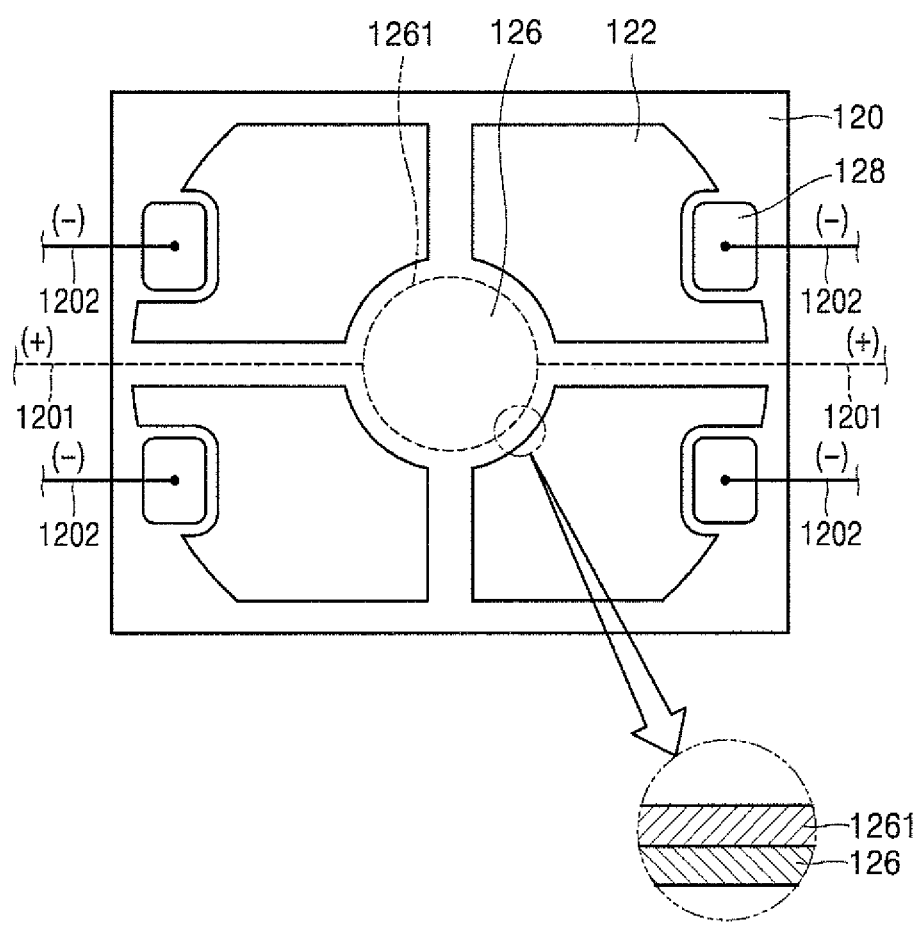
FIG. 5 is an enlarged view illustrating portion A of the touch substrate in FIG. 4.
Figure 6:
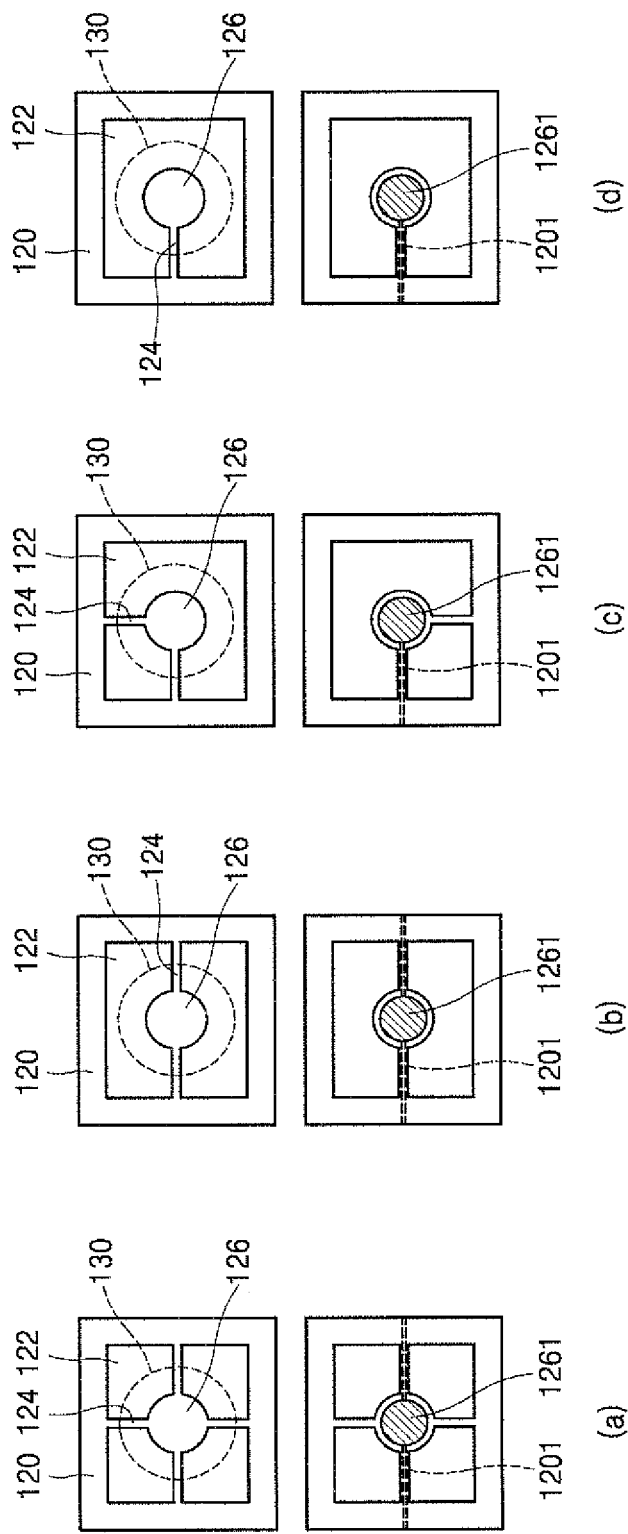
FIG. 6 is a view illustrating other examples of the touch substrate in FIG. 5.

Referring to FIGS. 5 and 6, an opening or cut-out including at least one hole 122 may be formed on the touch substrate 120 in every location that corresponds to a touch point 21. The opening may be split into a plurality of holes 122 via at least one leg or connector 124. The hole 122 may have a shape of a polygon, but the shape of the hole 122 is not restricted. As exemplified in FIG. 5, the opening may be split into four holes 122 arranged in separate quadrants around a press portion or region 126 of the touch substrate 120. A press region or area 126 may be provided at inner sides of the holes 122 at a center of the opening.

The press region 126 may be aligned with a center of a touch point 21 of the front panel 20. The leg 124 may extend from an inner circumferential surface of the opening to the press region 126 and the press region 126 may connect to a distal end of the leg 124. The shape of the press region 126 may correspond to a shape of the piezo disc 130, and a size of the press region 126 may be smaller than or equal to that of the piezo disc 130. The piezo disc 130 may, for example, have the shape of a circular plate or disc, and the press region 126 may have the shape of a corresponding circle. However, the shapes of the piezo disc 130 and the press region 126 are not restricted.

The press region 126 may provide flexibility to the touch substrate 120. When a main body of the touch substrate 120 is connected to the press region 126 by the leg 124, which may be relatively thin, the press region 126 may flexibly move. When the user presses the touch points 21 of the front panel 20, a pressing force may be delivered to the press region 126. Accordingly, the press region 126 may be pressed in a direction that the pressing force is applied.

The press region 126 and leg 124 may further be configured to have a durability that withstands repetitive pressing. Accordingly, the configuration of the press region 126, opening and holes 122, and legs 124 may be modified as long as the press region 126 and at least one leg 124 are durable and allow flexible movement in accordance with a touch pressure of the user. FIG. 6 exemplifies various configurations of the holes 122, legs 126, and press region 124.

For instance, as exemplified in FIG. 5 and view (a) of FIG. 6, four legs 126 may be provided at 90-degree intervals to provide four holes 122 separated in four quadrants. View (b) of FIG. 6 provides a beam structure in which two legs 126 may be spaced apart by 180 degrees, and the opening has two holes 122. View (c) provides a cantilever structure in which two legs are spaced apart by 90 degrees and the opening has two holes 122 of different sizes. View (d) provides a cantilever structure in which a single leg 124 extends across a single hole 122 of the opening. Compared with other structures, cantilever structures may render the press region 126 more flexible and to be easily deformed by a touch pressure of the user, improving sensitivity. The configurations of the legs 124 and the holes 122 are not limited to those exemplified in FIG. 6. However, for convenience of description, the configuration shown in FIG. 5 and FIG. 6, view (a) will be described.

At least one fixing surface 128 that fixes to a fixed leg part or extension 148 (FIG. 8) of the holder 140 may be provided near a hole 122. The fixing surface 128 may be a surface on which the extension 148 of the holder 140 is soldered. The fixing surface 128 may be provided at an outer side of the hole 122 or near an outer circumferential surface of the opening, and may protrude toward an inside of the hole 122. However, the location of the fixing surface 128 is not restricted.

As previously described, the entire touch substrate 120 may have a shape of a slim or long rectangle. Long sides (i.e., sides along the length) of the holes 122 may be arranged in a direction corresponding to a length-wise direction of the touch substrate 120 to maintain a slim shape of the touch substrate 120. Additionally, the fixing surface 128 may be provided on a short side (i.e., a side along the width) of the hole 122, and an insertion hole or space 141 (FIG. 8) of the holder 140 may be open toward a rear side of the touch substrate 120. The insertion space 141 of the holder 140 may be defined by walls 146 protruding from a bottom surface of a rear support 142. The piezo disc 130 may be easily inserted in the insertion space 141 when a guide groove or recess 147 is formed in an edge of the rear support 142 that does not include a wall 146.

The legs 124, the press region 126, and the fixing surfaces 128 may be manufactured at a time when the holes 122 of the opening are made. The touch substrate 120 may, for example, be cut such that the holes 122 are formed, and the legs 124 and the press region 126 may be a remaining portion of the touch substrate 120.

The touch substrate 120 may include a plurality of electric cables. A first cable 1201 may pass through the press region 126 and the leg 124, and a second cable 1202 may pass through the fixing surface 128. The first and second cables 1201 and 1202 may be used to determine whether pressure is applied to the piezo disc 130. When there is a potential difference due to pressure applied to the piezo disc 130, an electromotive force may be sensed through the first and second cables 1201 and 1202.

Figure 8:
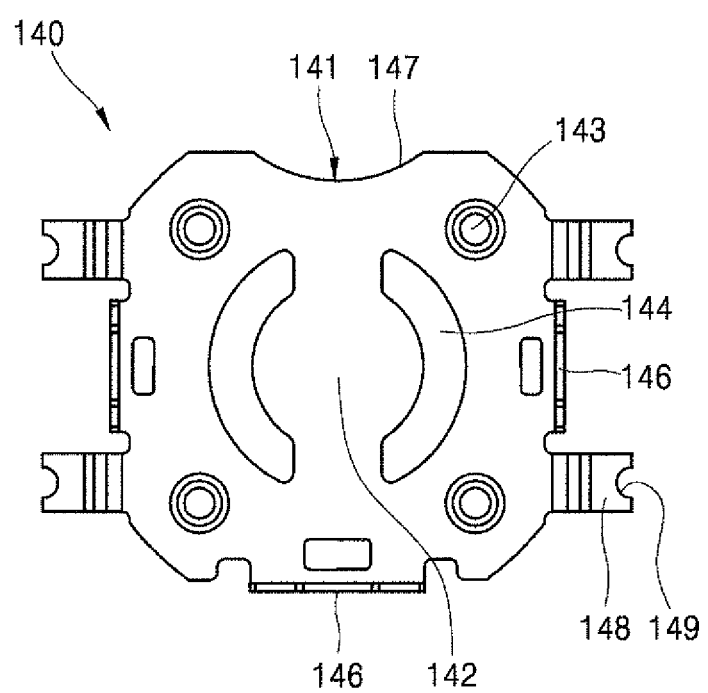
FIG. 8 is a view illustrating the holder in FIG. 4.

Referring to FIGS. 4, 8 and 9, at least one holder 140 may be fixed to the touch substrate 120 behind the at least one hole 122 of the opening. The piezo disc 130 may be inserted and secured into a space between the holder 140 and the touch substrate 120.

The rear support 142 of the holder 140 may have a polygon shape to cover a large portion of the holes 122 of the opening of the touch substrate 120. When the holder 140 is fixed onto the touch substrate 120, the support 142 may be spaced a predetermined distance apart from a rear surface of the touch substrate 120. A gap between the rear support 142 and the rear surface of the touch substrate 120 may be defined by a lateral support or wall 146 that is bent at an approximately right angle from an outer edge of the rear support 142.

The extension 148 may electrically connect to the fixing surface 128 through the process of soldering, and may be provided on the same sides of the holder 140 from which walls 146 extend. The extension 148 may extend outward from an upper end or edge of the wall 146 (as shown in FIG. 9), and an upper end of the wall 146 may contact the touch substrate 120.

As an example, a pair of fixing surfaces 128 may be provided on shorts sides of the opening and protrude from short sides of the holes 122. As exemplified in FIG. 5, a total of four fixing surfaces 128 may be provided. Four extensions 148 may be provided in positions corresponding to those of the fixing surfaces 128. The extensions 148 may have or include a flat surface shape that contacts the fixing surface 128 and may have a via-hole or recess 149 at an end thereof to improve solder adhesion with the fixing surface 128. When the extension 148 extends from an upper edge of the wall 146, the extension 148 may be a flat plate that is parallel to a surface of the rear support 142.

The extension 148 may extend in the length-wise direction of the touch substrate 120. Accordingly, the insertion space 141 of the holder 140 may be open outward toward a length (i.e., lateral) side of the touch substrate 120. As a result, the piezo disc 130 may be easily inserted between the holder 140 and the touch substrate 120.

When viewed from a side of a refrigerator door 1, the wall 146 may extend outward, or toward a front, from two short sides and one long side among the sides of the polygon-shaped rear support 142. The piezo disc may thus be inserted between the walls 146 when placed onto the holder 140. The wall 146 may support a lateral surface or side of the piezo disc 130 that is placed onto the holder 140 to prevent the piezo disc 130 from escaping from the holder 140 during assembly.

The extension 148 may be provided next to the wall 146 on the two short sides of the rear support 142. A pair of extensions 148 may extend from the walls 146 provided on the short sides of the rear support 140. The insertion space 141 into which the piezo disc 130 may be inserted may be formed on a long side of the rear support 142 which is not provided with a wall 146. A guide groove 147 may be formed at the insertion space 141. The guide groove 147 may have a shape of an arc to guide an end of the piezo disc 130 toward the insertion hole 141 when the piezo disc 130 is inserted. The guide groove 147 may open toward a lateral line, lengthwise side in widthwise direction.

Figure 7:
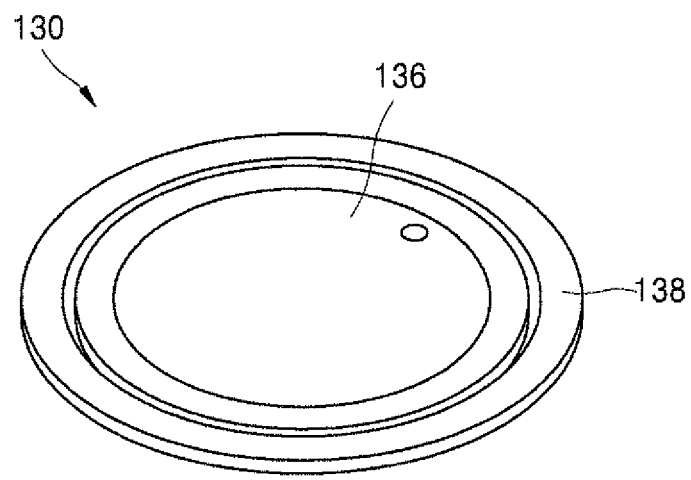
FIG. 7 is a view illustrating the piezo disc in FIG. 4.
Figure 7:
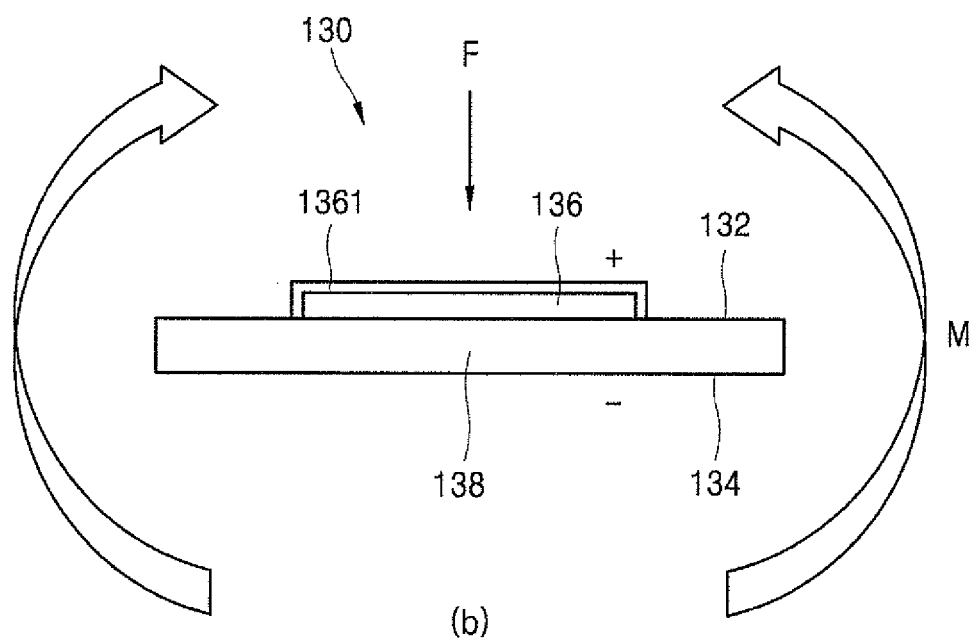

Referring to FIG. 7, the rear support 142 may support a rear surface or side 134 of the piezo disc 130. At least one pressing protrusion 143 that presses and supports an edge of the rear surface of the piezo disc 130 may be provided near an outer edge of the rear support 142. The pressing protrusion 143 may be provided in a position so as not to overlap with a first pole or ceramic disc 136 provided on a front surface or side 132 of the piezo disc 130.

The first pole 136 may be provided in a central portion of the front surface 132 of the piezo disc 130 and may slightly protrude outward toward a front. The first pole 136 may be pressed and supported by the touch substrate 120 while contacting the press region 126 of the touch substrate 120.

When a user presses the touch area 22, the press region 126 may press the first pole 136, and the pressing protrusion 143 of the holder 140 may press an edge of the rear surface 134 of the piezo disc 130. Accordingly, the piezo disc 130 may be tightly secured such that a load applied to a portion of the piezo disc 130 corresponding to a potential difference (i.e., where the first pole 136 is located) is minimized.

Referring to FIGS. 7 and 8, at least one slit 144 may be formed around a central point of the rear support 142, and may be cut into an arc-shape. The slit 144 may be provided further inward (i.e., toward a center) than the pressing protrusion 143. A perimeter of the slit 144 may be easily deformed. Accordingly, a central portion of the rear support 142, at an inner side of the slit 144, may be deformed to a certain degree according to a deformation of a central portion of the rear surface 134 of the piezo disc 130, which may be minutely curved by the press region 126 and the pressing protrusion 143. When the user presses a touch point 21, the press region 126 of the touch substrate 120 may be pressed against a central portion of the rear surface 134 of the piezo disc 130, and an outer portion of the piezo disc 130 may press against the pressing protrusion 143 of the holder 140.

The holder 140 may be made of a metallic material that is electrically conductive, and a metallic plate having a flat plate shape may be easily formed into the pressing protrusion 143, slit 144, and wall 146 through pressing and/or piercing processes. The holder 140 may be fixed onto the fixing surface 128 through the extension 148, and may electrically connect to the second cable 1202 through the fixing surface 128. The fixing surface 128 may further support a second pole or metal plate 138 of the piezo disc provided on an outer portion of the front surface 132. The piezo disc 130 may thus be fixed onto the rear surface of the touch substrate 120, and the fixing surface 128 may electrically connect with the second pole 138 and the second cable 1202.

Referring to FIGS. 7 to 9, the second pole 138 may be a metallic flat plate that includes the front and rear surfaces 132 of the piezo disc 130, and the first pole 136 may be stacked above a central portion of the front surface 132. The first pole 136 may have a shape that slightly protrudes from the central portion of an outer surface of the second pole 138. The first pole 136 may, for example, be made of ceramic, and the second pole 138, may, for example, be made of metallic or conductive materials. A surface of the first pole 136 may be coated with an electrically conductive layer or conductive layer 1361 such as silver (Ag) for electrical conductivity.

The piezo disc 130, may, for example, have a circular flat plate shape, and a plurality of piezo discs 130 may be provided to correspond to a plurality of touch points 21. A diameter of the piezo disc 130 may be the same or less than a gap between walls 146 that are provided on short sides of the rear support 142 of the above-described holder 140. Thus, a diameter or size of the piezo disc 130 may be equal to or less than a size of the insertion space 141.

The piezo disc 130 may be provided between the touch substrate 120 and the holder 140. When the piezo disc 130 is inserted between the holder 140 and the touch substrate 120, the guide groove 147 may help guide the insertion of the piezo disc 130. When the piezo disc 130 is inserted, the front surface 132 onto which the first pole 136 is stacked may face the touch substrate 120, and the rear surface 134 may face the holder 104.

When pressure is applied to press the first pole 136 and the second pole 138 of the piezo disc 130, a potential difference occurs between the first pole 136 and the second pole 138. The first cable 1201 may be configured such that the press region 126 electrically connects to the first pole 136 when the press region 126 contacts the first pole 136, but the leg 124 of the touch substrate 120 may not electrically connect to the second pole 138 despite contacting the second pole 138.

For example, the first cable 1201 may be exposed in the press region 126, but not exposed along the leg 124. he press region 126 may include a connector 1261 that is made of copper or gold, and a plurality of first cables 1201 may electrically connect to the connector 1261 respectively.

The holder 140 may be made of a metallic or conductive material that contacts and electrically connects to the rear surface 134 of the second pole 138. The first cable 1201 of the press region 126 may pass through the leg 124, connect to the touch substrate 120, and connect with the wafer assembly 150 (FIG. 4). The fixing surface 128 of the touch substrate 120, which is soldered with the extension 148 of the holder 140, may also connect to the touch substrate 120 by the second cable 1202 and connect with the wafer assembly 150.

At least one wafer assembly 150 may be provided on the touch substrate 120 to connect to a plurality of piezo discs 130. The positions of the plurality of piezo discs 130 may correspond to positions of a plurality of holders 140 and positions of a plurality of press regions 126 in the touch substrate 120. Accordingly, when the user presses a touch point 21 with a predetermined force F, a corresponding press region 126 may press a corresponding piezo disc 130. The press region 126 may press the central portion of the front surface 132 of the piezo disc 130, and the pressing protrusion 143 of a corresponding holder 140 may support the edge of the rear surface 134 of the piezo disc 130. The piezo disc 130 may receive a moment M and may be deformed, and a potential difference may occur between the first pole 136 and the second pole 138. According to an electromotive force that occurs in the above-described process, a micro-current may be delivered to a controller (not shown) (e.g., processor) through the first and second cables 1201 and 1202 of the touch substrate 120 and the wafer assembly 150, and the controller may sense that the touch points 21 have been touched.

The connector 1261 exposed to the press region 126 and the conductive layer 1361 coating the surface of the first pole 136 may be subject to corrosion. The connector 1261 may be made of copper (Cu) and formed in the press region 126, and the conductive layer 1361 may be made of silver (Ag) and formed in the first pole 136, which may be made of ceramic. When the connector 1261 and the conductive layer 1361 are exposed to air for a long time, the connector 1261 and the conductive layer 1361 may be oxidized. As a result, there may be a problem with an electrical connection of the connector 1261 and the conductive layer 1361. To prevent this corrosion, the touch sensor assembly 100 may further include a cover or sensor housing 200 described later.

The wafer assembly 150 may be installed or mounted on the rear surface of the touch substrate 120 in a region between the openings having the holes 122. The wafer assembly 150 may electrically connect an outside of the touch sensor assembly 100 and the piezo disc 130. The wafer assembly 150 may be connected to the first and second cables 1201 and 1202, and may electrically connect to a power supply or other electric components in the refrigerator 1. As an example, an order of assembling the touch substrate 120, the piezo disc 130, the holder 140 and the wafer assembly 150 of the touch sensor assembly 100 is described with reference to FIGS. 4, 8 and 9.

First, the holder 140 may be soldered with and fixed onto the rear surface of the touch substrate 120 via the extension 148 and the fixing surface 128. Next, the wafer assembly 150 may be mounted on the rear surface of the touch substrate 120 in a region adjacent but not directly behind, to the holder 140. This mounting process may be automated.

Next, the piezo disc 130 may be inserted between the holder 140 and the touch substrate 120. The guide groove 147 may guide an insertion of the piezo disc 130 so that a worker or assembler may easily insert the piezo disc 130 manually. The piezo disc 130 may be circular, while the wall 146 of the holder 140 may have a polygon shape. Accordingly, once the worker inserts an end portion of the piezo disc 130 into the insertion space 141 and presses the piezo disc 130, the circular edge of the piezo disc 130 naturally guides the piezo disc 130 into the holder 140.

As an example, the touch substrate 120 may have a long rectangle shape, and long sides of polygon-shaped holes 122 that form polygon-shaped openings may be arranged along long sides of the touch substrate 120. The insertion space 141 of the holder 140 may be formed to free or open toward the long sides of the opening. Accordingly, the worker may insert the piezo disc 130 from a lateral surface or side of the touch substrate 120 into the holder 140, and the piezo disc 130 may be easily inserted.

Figure 10:
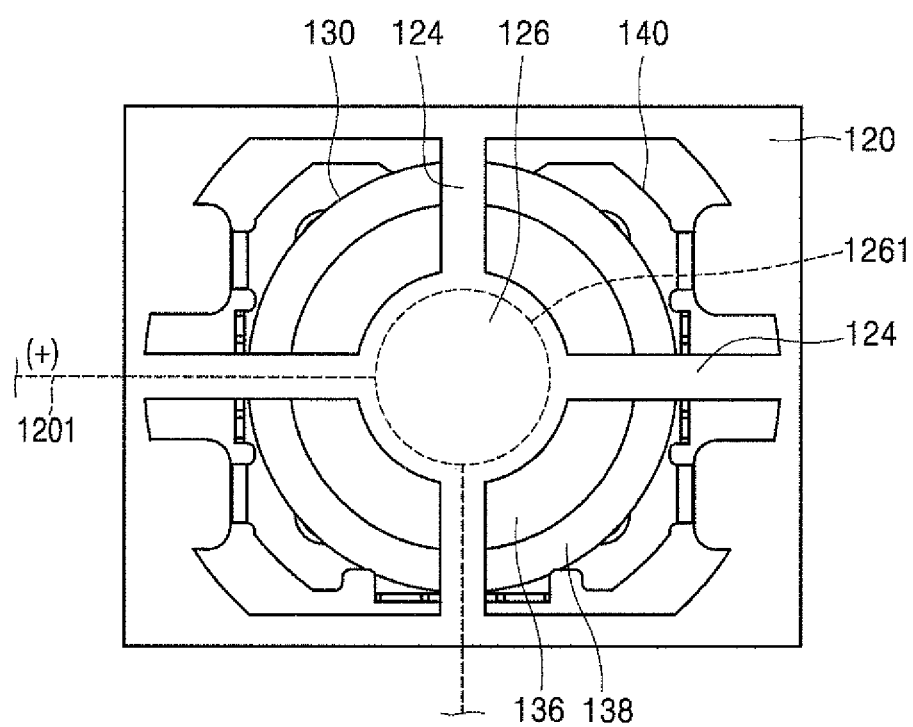
FIG. 10 is a front view illustrating the state in which some elements of the touch sensor assembly in FIG. 4. are assembled.
Figure 11:
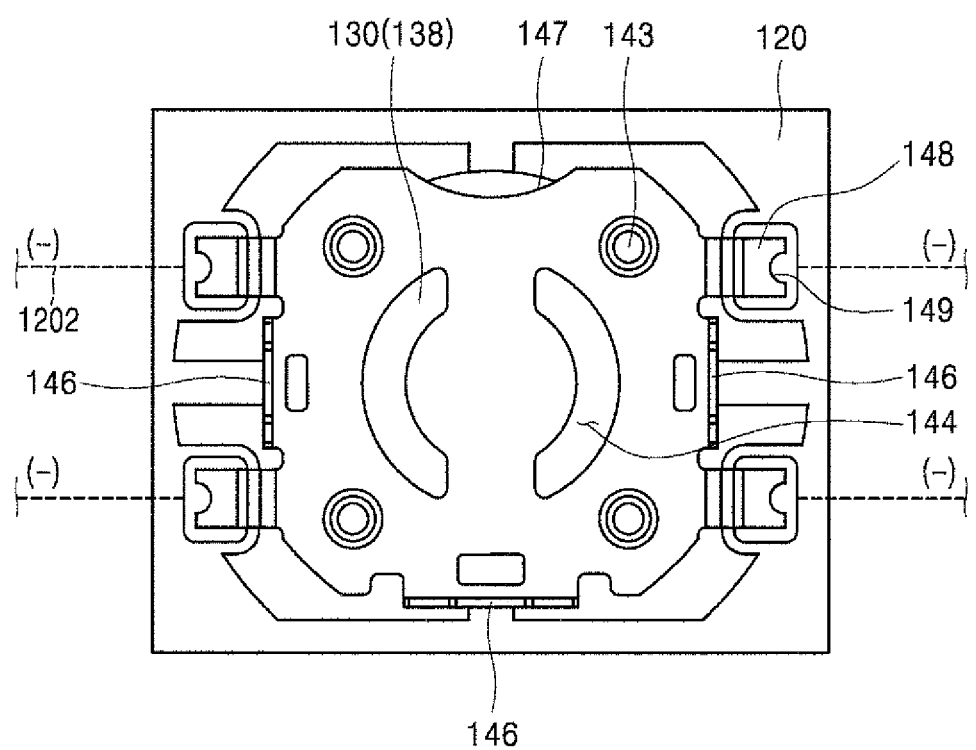
FIG. 11 is a rear view of FIG. 10.

FIGS. 10 and 11 show front and rear surfaces of a touch portion of the touch sensor assembly 100 in a half-assembled state where the extension 148 of the holder 140 is fixed onto the fixing surface 128 of the touch substrate 120 and the piezo disc 130 is inserted. Next, a second adhesive member 190 (FIG. 12) may adhere to the rear surface of the touch substrate 120. This adhering process may also be automated.

Release paper may be attached and stacked with the first adhesive member 110. The release paper may be removed right before the touch sensor assembly 100 is attached to the front panel 20 of the refrigerator door 10 to prevent reduced adhesion of the surface of the first adhesive member 110.

Figure 12:
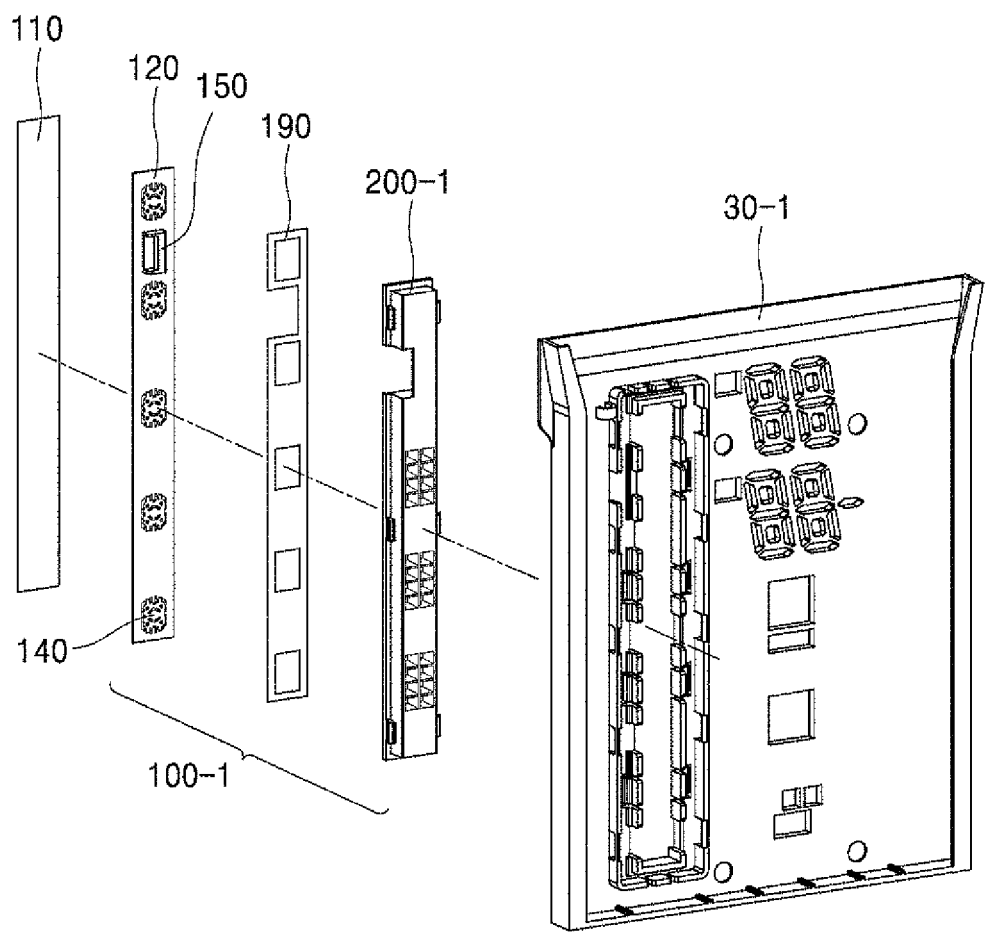
FIG. 12 is an exploded perspective view illustrating an example of the touch sensor assembly and the display cover in FIG. 3.
Figure 13:
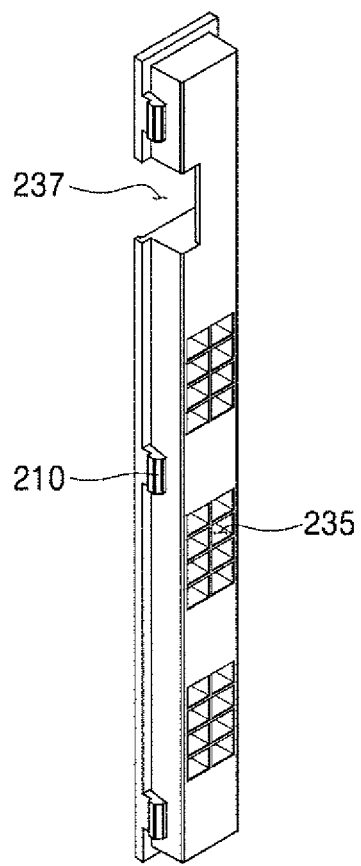
FIG. 13 is a perspective view illustrating the cover in FIG. 12.
Figure 14:
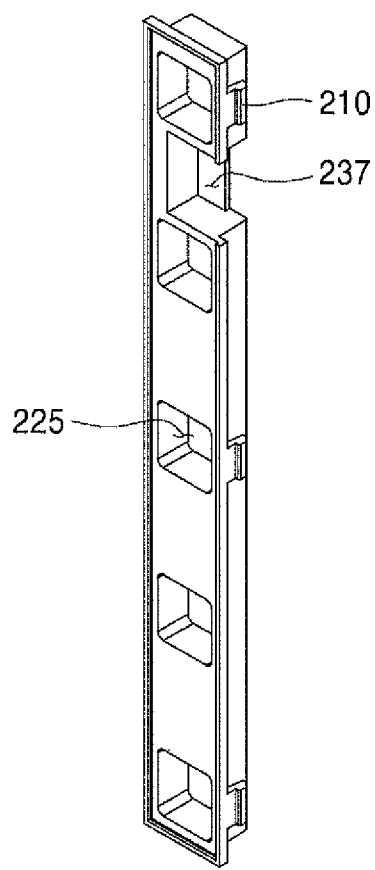
FIG. 14 is a perspective view illustrating the cover in FIG. 13 from a different point.
Figure 15:
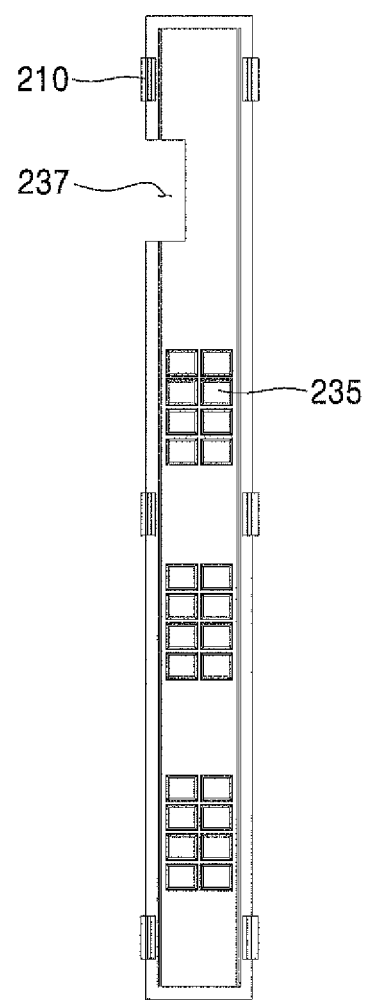
FIG. 15 is a rear view illustrating the cover in FIG. 13.
Figure 16:
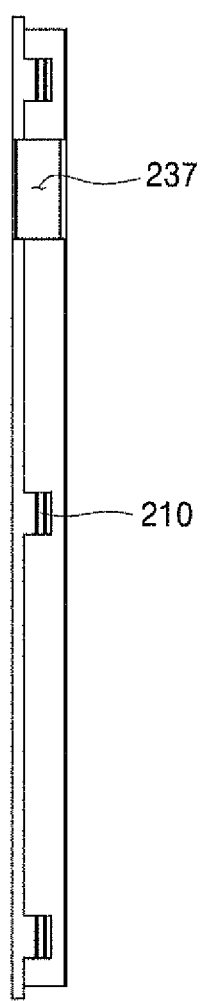
FIG. 16 is a side view illustrating the cover in FIG. 13.
Figure 17:
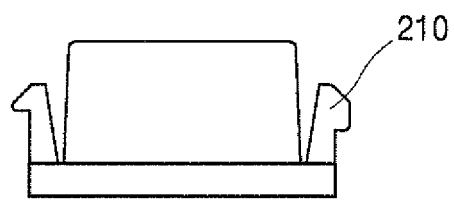
FIG. 17 is a plan view illustrating the cover in FIG. 13.
Figure 18:
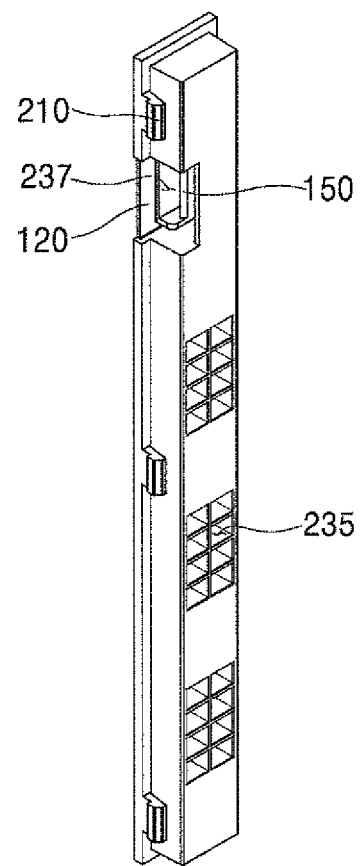
FIG. 18 is a perspective view illustrating the cover coupled with the touch substrate in FIG. 12.

FIG. 12 shows an example of a touch sensor assembly 100-1 and a display cover 30-1. The touch sensor assembly 100-1 may include a cover or sensor housing 200-1 in addition to the above-described touch substrate 120, piezo disc 130, holder 140, and wafer assembly 150.

The first adhesive member 110 may adhere the front surface of the touch substrate 120 to the front panel 20, and the second adhesive member 190 may adhere a front surface of the cover 200-1 to the rear surface of the touch substrate 120. The first and second adhesive members 110 and 190 may include a double-sided tape. Additionally, at least one of the first and second adhesive members 110 and 190 may be thin (e.g., 0.05 mm) such that force is easily delivered or transferred when the user touches the touch sensor assembly 100.

A high performance acrylic adhesive and primer may be applied to at least one of the first and second adhesive members 110 and 190 to ensure a higher intensity and/or longevity of adhesion. Additionally, at least one of the first and second adhesive members 110 and 190 may have a predetermined heat resistance (e.g., resistance against heat of 149° C. to 204° C.). When the high performance acrylic adhesive and primer is applied to the first and/or second adhesive member 110 and/or 190 with heat resistance, adhesion may last for a long time (e.g., ten years or more).

At least one of the first and second adhesive members 110 and/or 190 may have a predetermined insulation resistance (e.g. 1 MO or more of insulation resistance). Accordingly, static electricity may be prevented from being applied to the touch substrate 120 and/or being delivered to the user. By preventing an inflow of static electricity to the touch substrate 120, damage to a circuit may be prevented, and an electric shock and/or or a reduction in the quality of touch (caused by a microcurrent) may be further prevented.

The second adhesive member 190 may include a double-sided tape that has the same shape as a portion of the front surface of the cover 200-1 that is not overlapped with the holder 140. Referring to FIGS. 12-18, the cover 200-1 may be a housing that has a shape similar to that of a cuboid. The front surface of the cover may adhere to the rear surface of the touch substrate 120 via the second adhesive member 190, and a cavity or recess 225 that is concavely formed in a direction away from the touch substrate 120 may be provided in a portion of the front surface of the cover 200-1 that is ultimately overlapped with (or provided behind) the holder 140. The cavity 225 may also be referred to as a concave part.

The cover 200-1 may be formed to protrude away from the touch substrate 120 to ensure space for the cavity 225. A plurality of cavities 225 may be provided to correspond to the plurality of holders 140. Accordingly, the cavity 225 may be concavely formed to encircle the piezo disc 130 and the holder 140, and a non-recessed portion of the front surface of the cover 200-1, which is not overlapped with the holder 140, may adhere to the rear surface of the touch substrate 120 to seal the piezo disc 130 and the holder 140.

The piezo disc 130 may not be exposed to air due to the adhesion of the cover 200-1 to the touch substrate 120. The piezo disc 130 may therefore be prevented from being oxidized, preventing poor electrical contact due to oxidation.

When the touch substrate 120 is attached to the front panel 20 via the first adhesive member 110, a device such as a roller may be used to compress the touch substrate 120. The piezo disc 130 and the holder 140 attached to the touch substrate 120 may be at risk of being deformed or damaged when a roller is applied.

However, in this case, the cavity 225 may be provided to cover and/or accommodate the holder 140, and a non-recessed portion of the front surface of the cover 200-1 (not behind the holder 140) may be a flat surface to seal and protect the piezo disc 130 and the holder 140 by adhering to the rear surface of the touch substrate 120. Therefore, even when the touch substrate 120 is compressed by a device such as a roller, the piezo disc 130 and the holder 140 may be prevented from being deformed or damaged, and the touch substrate 120 may be evenly compressed by the roller.

The cover 200-1 may be made of a material that has high rigidity, has low mold shrinkage, and may be rarely curved or deformed. The cover 200-1, for instance, may be made of at least one of a modified polyphenylene oxide (MPPO), polybutylene terephthalate (PBT), and polycarbonate (PC). The non-recessed portion of the front surface of the cover 200-1 that adheres to the rear surface of the touch substrate 120 may serve as a wall that separates neighboring piezo discs 130 from each other.

Typically, when a user presses a touch point 21 too strongly, or when the user presses an area outside the touch points 21 (e.g., an area between the touch points 21), the pressing force may be unintentionally delivered to another (non-corresponding) piezo disc 130. Thus, the refrigerator 1 may operate incorrectly. Additionally, when the touch substrate 120 is long, and the surface area of the front panel 20 is large, the touch substrate 120 may be curved or the front panel 20 may oscillate by a touch of the user. Accordingly, the refrigerator 1 may operate incorrectly.

However, because the cover 200-1 serves as a wall that separates neighboring piezo discs 120 from each other, force may not be unintentionally delivered to another piezo disc 130. Additionally, the touch substrate 120 may not be warped or curved, and the front panel 20 may not oscillate because the cover 200-1 may be made of at least one of MPPO, PBT, and PC, thereby preventing force from being delivered incorrectly and minimizing a possibility of the refrigerator 1 operating incorrectly.

A lattice 235 may be formed in a portion of the rear surface of the cover 200-1 which is not overlapped with the cavity 225. A plurality of lattices 235 may be formed between a plurality of regions corresponding to cavities 225. The lattice 235 may have a shape of a rectangle or a diamond. With the lattice 235, injection material for the cover 200-1 may be saved, and bends are less likely to occur during injection molding.

Figure 19:
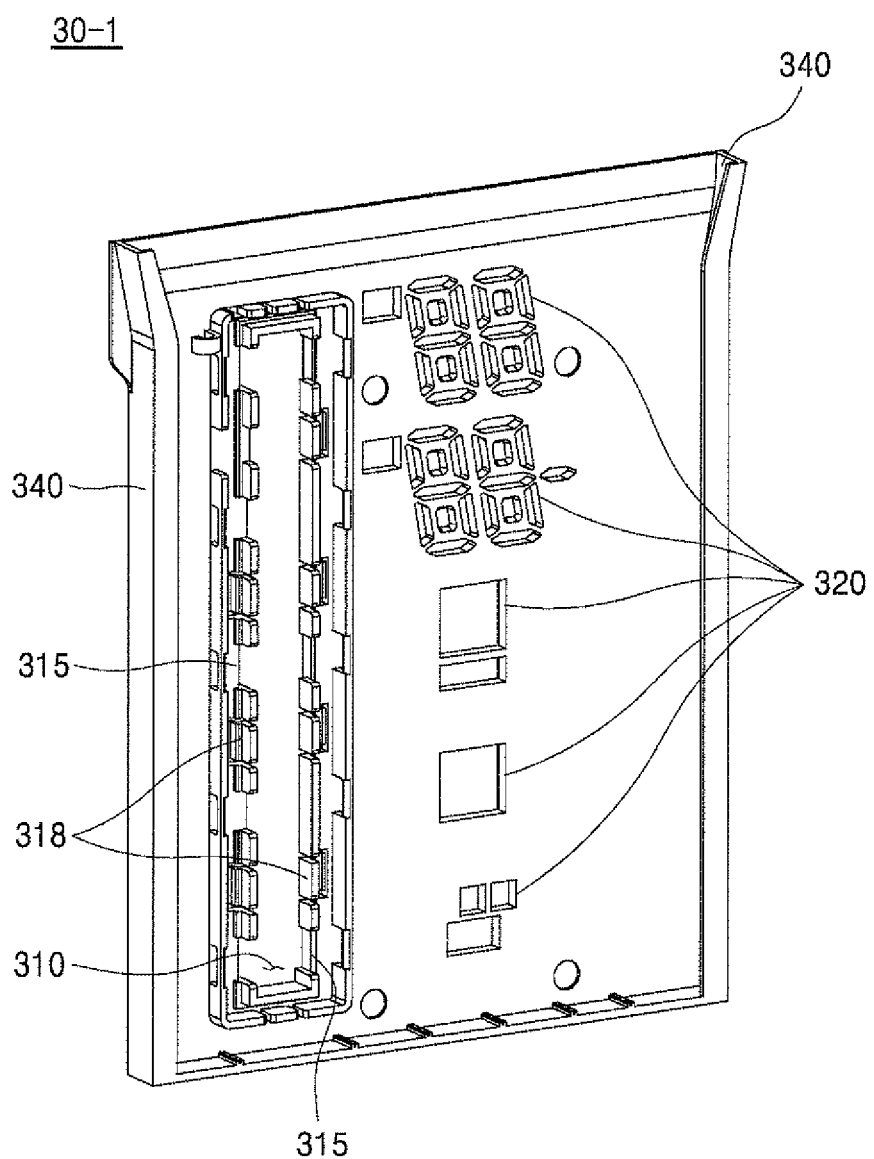
FIG. 19 is a perspective view illustrating the cover in FIG. 12.
Figure 20:
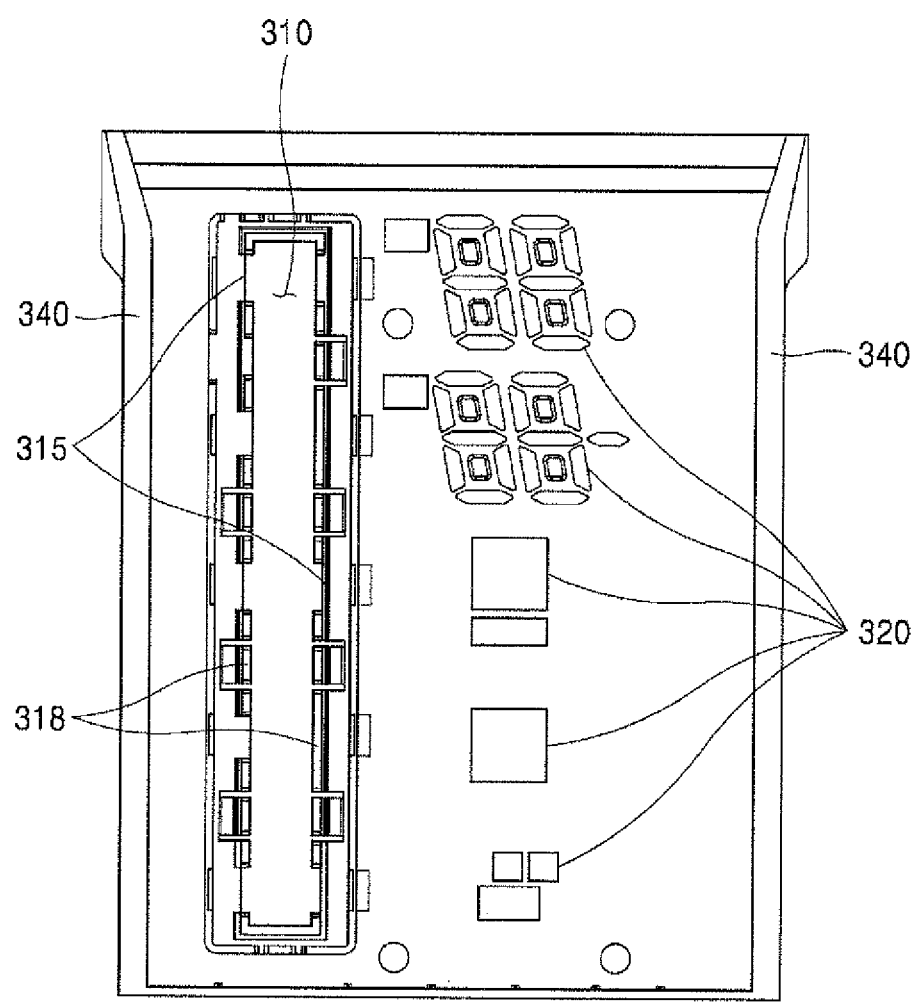
FIG. 20 is a rear view illustrating the cover in FIG. 19.
Figure 21:
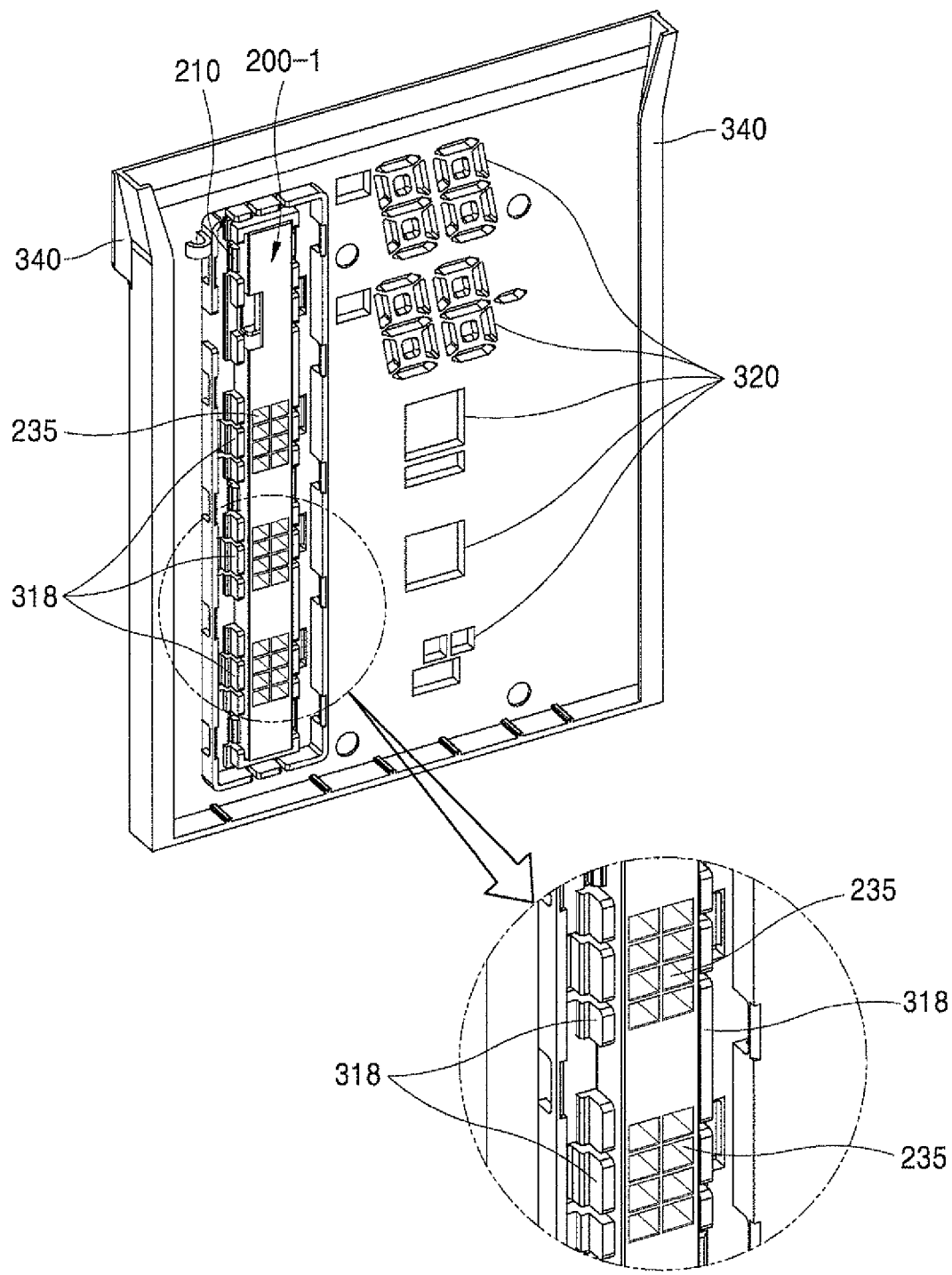
FIG. 21 is a perspective view illustrating the touch sensor assembly coupled with the display cover in FIG. 12.
Figure 22:
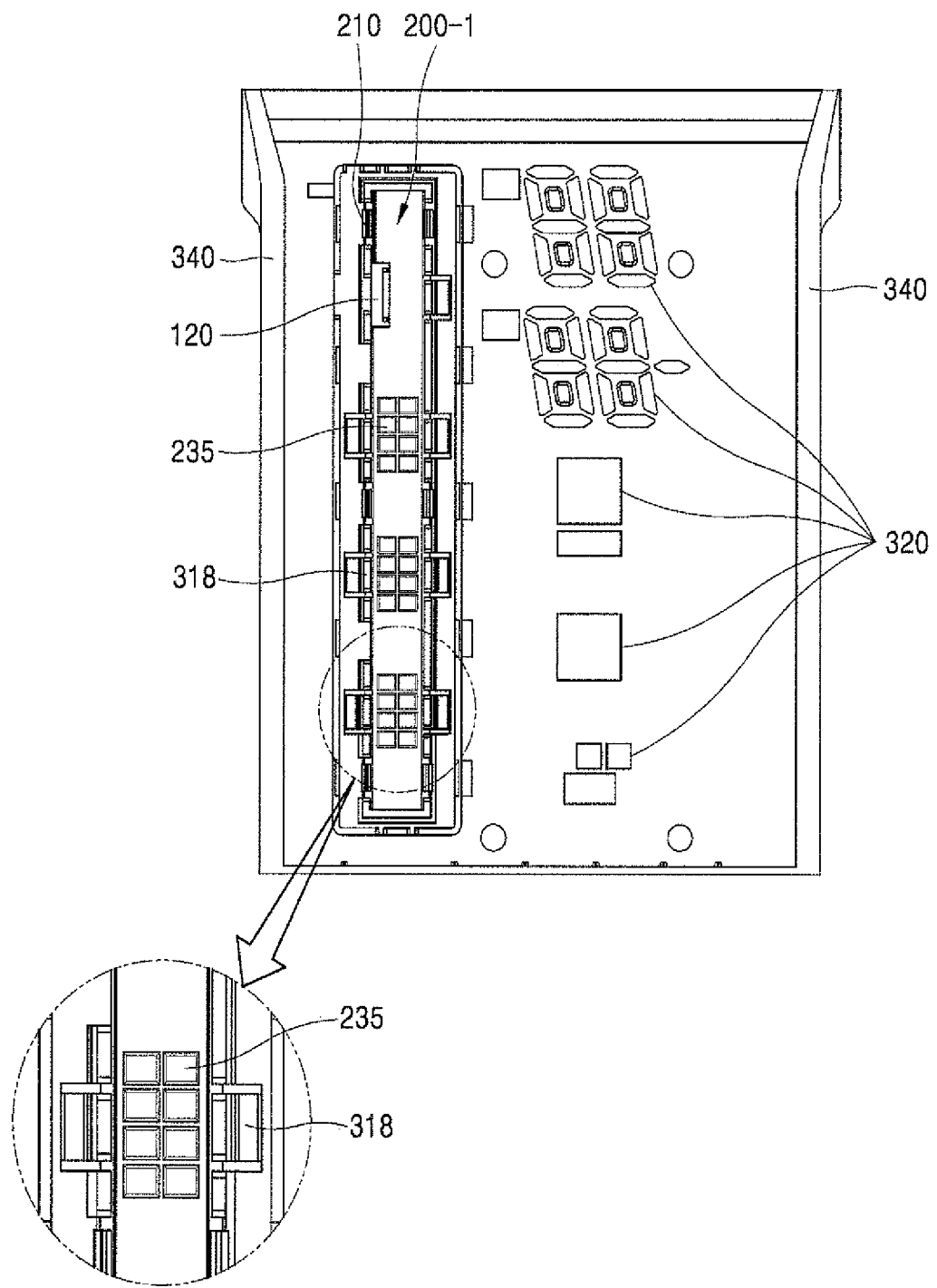
FIG. 22 is a rear view illustrating the touch sensor assembly coupled with the display cover in FIG. 21.
Figure 23:
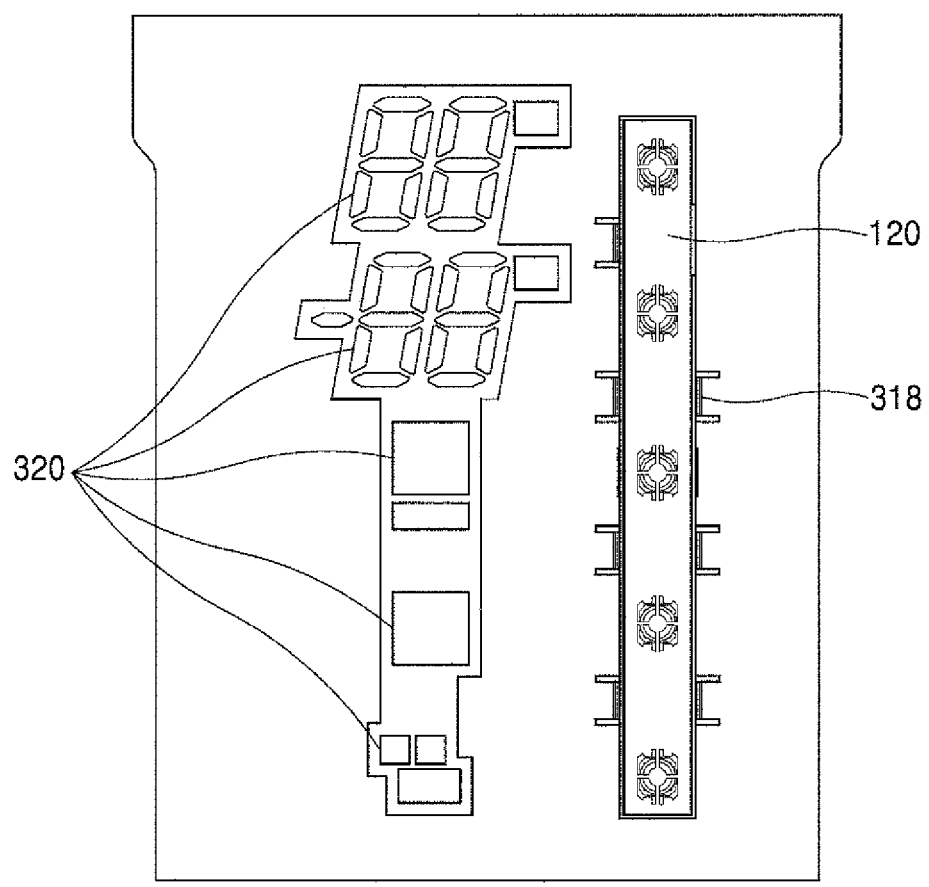
FIG. 23 is a front view illustrating the touch sensor assembly coupled with the display cover in FIG. 21.

A plurality of coupling hooks 210 that extend in a thickness-wise or depth direction (i.e., a front-rear direction) of the cover 200-1 may be provided at lateral (i.e., left and right) sides of the cover 200-1. The plurality of coupling hooks 210 may be formed in locations corresponding to positions of a plurality of hook grooves 315 (FIG. 19) of the display cover 30-1 (FIG. 19). The plurality of coupling hooks 210 may be provided in locations that face each other on the left and right sides of the cover 200-1 and may be regularly spaced apart from each other in the up-down (i.e., length-wise) direction.

The plurality of coupling hooks 210 may be held (but not fixed) respectively in the plurality of hook grooves 315 and may move in the front-rear direction. The cover 200-1 may therefore be coupled to (i.e., hung on or held in) the display cover 30-1 via a hook structure comprised of the coupling hook 210 and the hook groove 315 such that the touch substrate 120 and the display cover 30-1 integrally adhere to the front panel 20.

When the touch substrate 120 and the display cover 30-1 adhere to the front panel 20, the front surface of the touch substrate 120 should be level (i.e., sit flush) with the front surface of the display cover 30-1. Thus, an adhesive face (i.e., the front surface) of the touch substrate 120 and an adhesive face (i.e., the front surface) of the display cover 30-1 may be on the same plane and together form one surface.

Finally, an opening 237 to accommodate the wafer assembly 150 may be formed on a surface of the cover 200-1. The wafer assembly 150 may be exposed to an outside through the opening 237 by not contacting the front surface of the cover 200-1.

Figure 25:
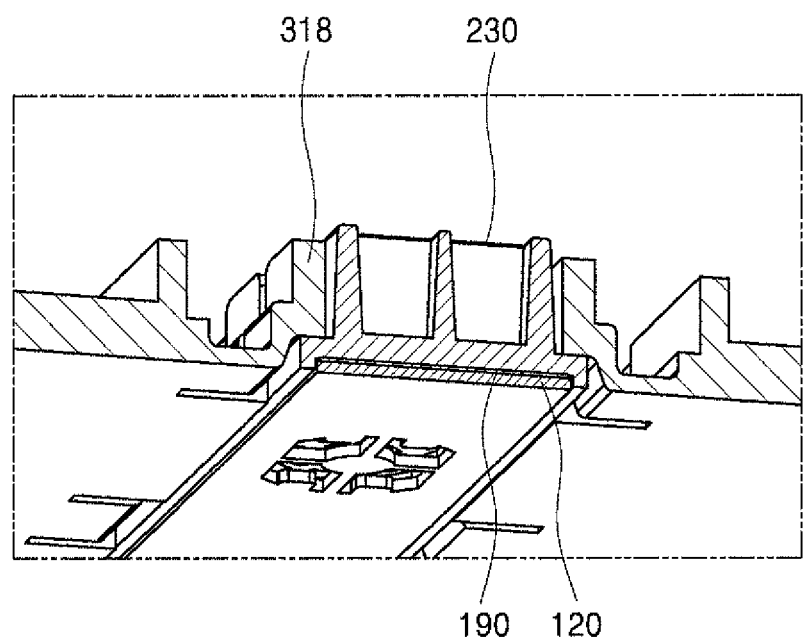

Referring to FIGS. 12, 19, and 25, the display cover 30-1 may adhere to the rear surface of the front panel 20 and may support the above-described cover 200-1 in an outward or forward direction. The display cover 30-1 may guide a display assembly (not shown) onto which at least one light emitting diode (LED) is mounted such that the display assembly is installed behind the display cover 30-1. The display cover 30-1 may be attached to the rear surface of the front panel 20 with a double-sided tape or an adhesive member to which primer is applied.

The above-described touch sensor assembly 100-1 may be installed in a predetermined region or side (e.g., a left or right side) of the front surface of the display cover 30-1. Accordingly, the display cover 30-1 may adhere to the rear surface of the front panel 20 while being coupled to the touch sensor assembly 100-1.

Additionally, the display cover 30-1 may be positioned such that penetration holes or through holes 320 formed on the display cover 30-1 are matched with the display area 11 on the rear surface of the front panel 20. Accordingly, light emitted from the at least one LED mounted onto the display assembly may pass through the penetration hole 320 of the display cover 30-1 to the display area 11 and may be emitted outward to illuminate the display area 11.

The penetration holes 320 may be formed on the front surface of the display cover 30-1. Some of the penetration holes 320 may be open in a shape corresponding to a seven-segment while other penetration holes 320 may be open in a shape of various holes to display additional information. The shapes of the penetration holes 320 are not limited.

The display assembly may be installed in a frame assembly or display frame (not shown), and the frame assembly, having the display assembly installed therein, may be installed in the display cover 30-1. The frame display may be installed in the display cover 30-1 through a guide rail (or rail guide) 340 that is formed at left and right sides or edges of the display cover 30-1. The guide rail 340 may be formed to be bent at both ends of the display cover 30-1. If the display cover 30-1 is made from a bendable material, e.g., metallic, the guide rail 340 may be formed at both ends of the display cover 30-1 by bending the ends a plurality of times, and a sliding insertion portion of the frame assembly may be inserted into the inside of the display cover 30-1 along the guide rail 340.

The guide rail 340 may have a wide upper end. In addition, a forward and backward width (groove thickness) at an upper end of the guide rail 340 may be greater than a forward and backward width at a lower end portion to facilitate insertion of the frame assembly. Further, a rear or inner side of the guide rail 340 may be inclined toward the front surface of the display cover 30-1 such that a groove width decreases toward a lower portion of the guide rail 340. Accordingly, the frame assembly may be easily inserted into the guide rail 340 such that when the frame assembly is further inserted, the display assembly that is installed in the frame assembly may contact the display cover 30-1 more closely.

An accommodation portion or opening 310 that accommodates the cover 200-1 may be formed on a side or region (e.g., right or left side) of the front surface of the display cover 30-1. The accommodation portion 310 may be formed at a side adjacent to a side having the penetration holes 320.

The accommodation portion 310 may have an opening or recess of a shape corresponding to a shape of the cover 200-1, and the cover 200-1 may be inserted into the accommodation portion 310. The cover 200-1 may be pressed-fit or friction fitted into the accommodation portion 310, and/or may hang via a hook structure. When the cover 200-1 to which the touch substrate 120 is attached is installed in the accommodation portion 310, the front surface of the touch substrate 120 (and a front surface of the touch sensor assembly 100-1) and the front surface of the display cover 30-1 may be on the same plane, i.e., the front surfaces are flush with each other.

The accommodation portion 310 may extend backward or rearword along an open perimeter. Accordingly, when the touch sensor assembly 100-1 is installed in the accommodation portion 310, the accommodation portion 310 contacts a peripheral or lateral surface of the touch sensor assembly 100-1 and/or cover 200-1 such that the touch sensor assembly 100-1 may be stably installed.

Further, a plurality of hook grooves 315 may be formed along edges of the accommodation portion 310. The plurality of hook grooves 315 may be formed in locations corresponding to those of the plurality of coupling hooks 210 that are provided in the cover 200-1, and may be formed by cutting a part of the edges of the accommodation portion 310. The plurality of hook grooves 315 may be formed in locations that face each other on the left and right sides of the accommodation portion 310 and may be regularly spaced apart from each other in the up-down direction so as to prevent the cover 200-1 from leaning in one direction.

The hook grooves 351 may have a long shape in the front-rear direction. Accordingly, the coupling hook 210 may move in the front-rear direction while resting on or being held in an inner side of the hook groove 315. The cover 200-1 may thus move by a predetermined distance in the front-rear direction when inserted into the accommodation portion 310.

Figure 24:
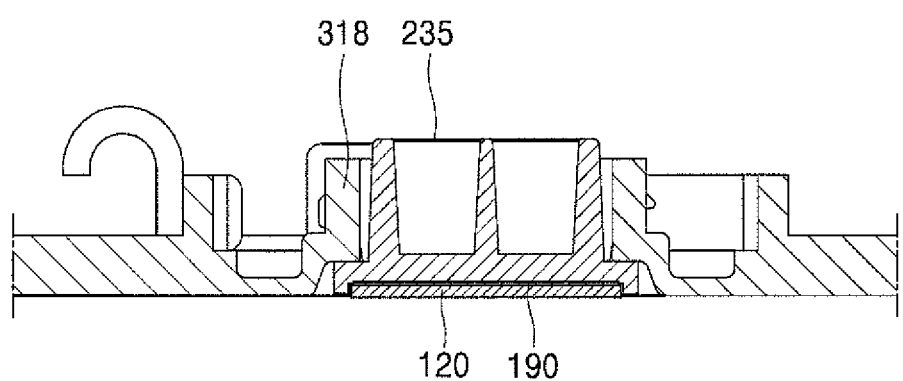
FIGS. 24 and 25 are views illustrating a support hook of the display cover in FIG. 21.

A plurality of support hooks or supporters 318 may be provided on lateral (i.e., left and right) edges of the accommodation portion 310. The plurality of support hooks 318 may be provided in locations that are not overlapped with the plurality of hook grooves 315 and may extend in the front-rear direction. A partial section of the support hook 318 may be bent or stepped. As in FIGS. 24 and 25, bent or stepped sections of the plurality of support hooks 318 may support the rear surface at lateral edges of the cover 200-1 to push or support the cover 200-1 in the forward direction such that adhesion of the first and second adhesive members 110 and 190 may be maintained. The support hooks 318 may further prevent the cover 200-1 from tilting or leaning in a direction and prevent the cover 200-1 from being displaced. As in FIGS. 21 to 25, the display cover 30-1 may stably accommodate the cover 200-1 and may push or support the cover 200-1 in the forward direction.

Below, another example of the touch sensor assembly and the display cover in FIG. 3 is described with reference to FIGS. 26 to 33. The below example of the touch sensor assembly and the display cover has the same features as the previous example of the touch sensor assembly and the display cover in some aspects. The same features are omitted hereunder.

Figure 26:
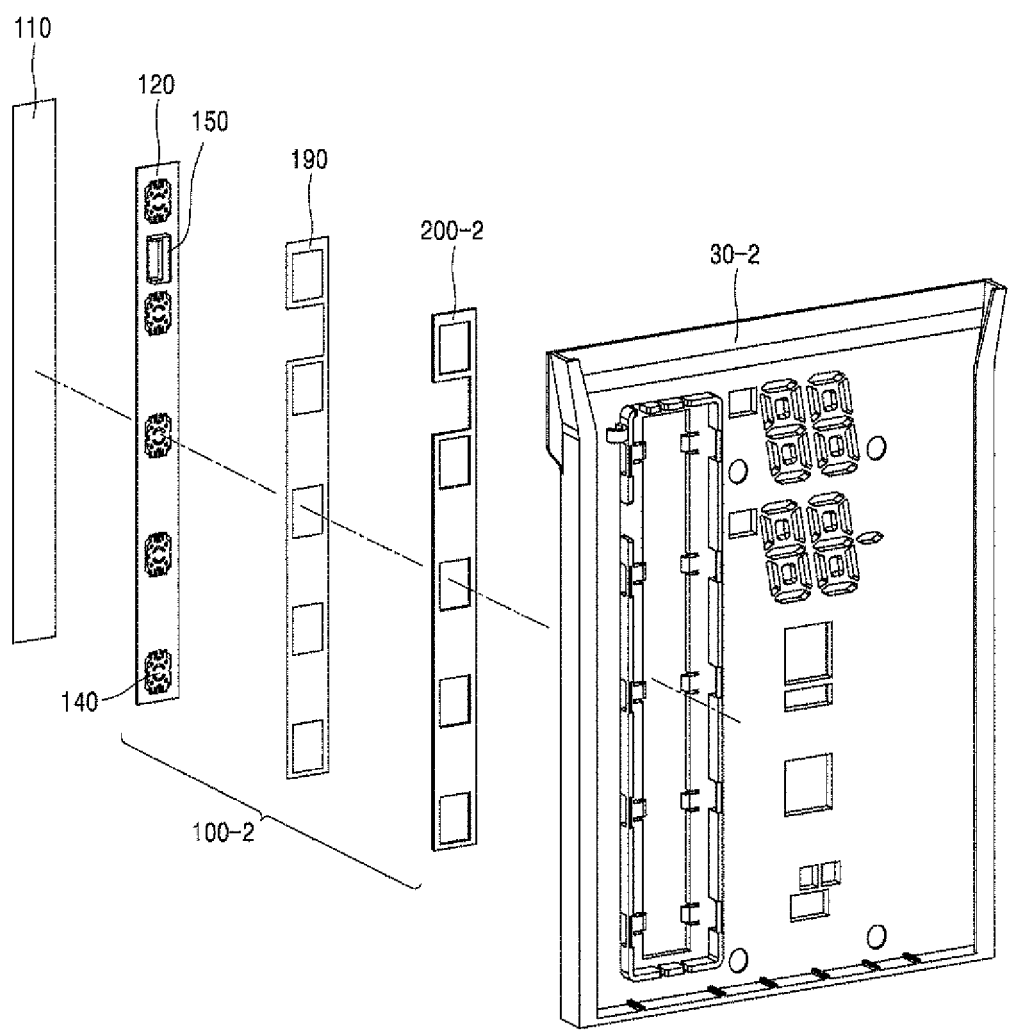
FIG. 26 is an exploded perspective view illustrating another example of the touch sensor assembly and the display cover in FIG. 3.

FIG. 26 exemplifies a touch sensor assembly 100-2 and a display cover 30-2. Like the above-described touch sensor assembly 100-1 in FIG. 12, the touch sensor assembly 100-2 may include a cover 200-2 in addition to the touch substrate 120, the piezo disc 130, the holder 140, and the wafer assembly 150. A first adhesive member 110 may adhere the front surface of the touch substrate 120 to the front panel 20, and a second adhesive member 190 may adhere the front surface of the cover 200-2 to the rear surface of the touch substrate 120.

Figure 27:
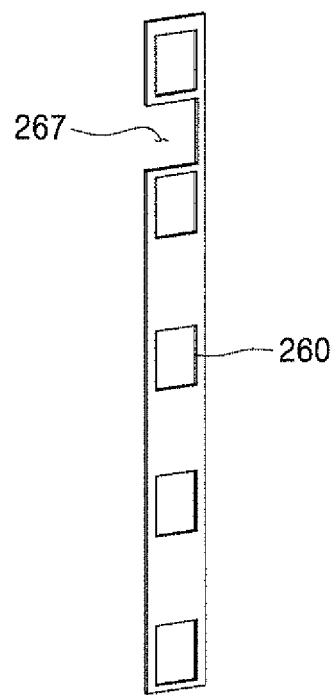
FIG. 27 is a perspective view illustrating the cover in FIG. 26.

However, the cover 200-2 may have a different shape and structure from the cover 200-1 in FIG. 12. Referring to FIGS. 26 and 27, the cover 200-2 may have the shape of a cuboid with a small thickness or may be formed as a thin substrate. An open hole 260, rather than a cavity 225, may be formed in a portion of the front surface that overlaps with the holder 140.

Accordingly, a plurality of open holes 260 may be provided to correspond to a plurality of holders 140. The open hole 260 may not enclose or contact the piezo disc 130 and the holder 140. The front surface of the cover 200-2 (not including the open holes 260) may adhere to the rear surface of the touch substrate 120 and may serve as a wall that separates neighboring piezo discs 130 from each other.

The cover 200-2 may be made of a material that has a high rigidity, low mold shrinkage, and low curvature and/or flexibility. The cover 200-2, for instance, may be made of at least one of modified polyphenylene oxide (MPPO), polybutylene terephthalate (PBT), and polycarbonate (PC).

When the user presses the touch points 21 strongly or presses an area outside (e.g., between) the touch points 21, a pressing force may be delivered to another piezo disc 130 that is not intended to be touched, resulting in the refrigerator 1 operating incorrectly. Additionally, when the touch substrate 120 is long and the surface area of the front panel 20 is large, the touch substrate 120 may be inadvertently curved or the front panel 20 may oscillate by a touch of the user. Accordingly, the refrigerator 1 may operate incorrectly.

Because the cover 200-2 may serve as a wall that separates neighboring piezo discs 130 from each other, force may not be unintentionally delivered to another piezo disc 130. Additionally, the touch substrate 120 may not be curved or the front panel 20 may not oscillate because the cover 200-2 is made of at least one of MPPO, PBT, and PC. Thus, the cover 200-2 may prevent force from being delivered incorrectly, thereby making it possible to minimize the possibility of incorrect operations.

Figure 28:
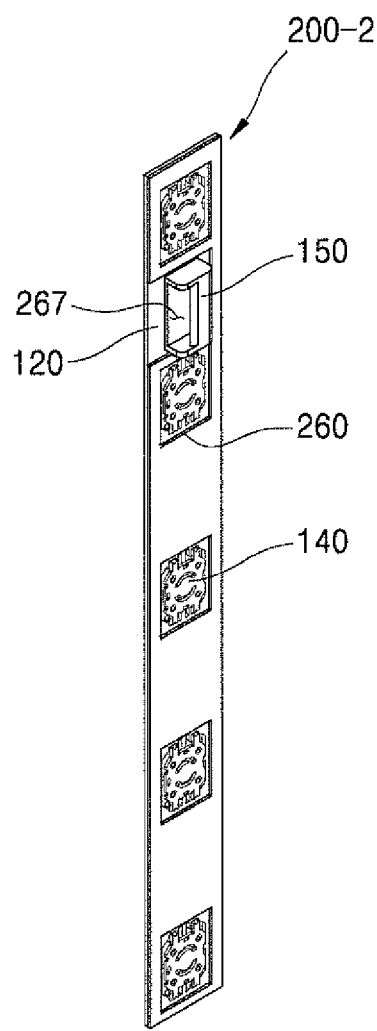
FIG. 28 is a perspective view illustrating the cover coupled with the touch substrate in FIG. 26.
Figure 29:
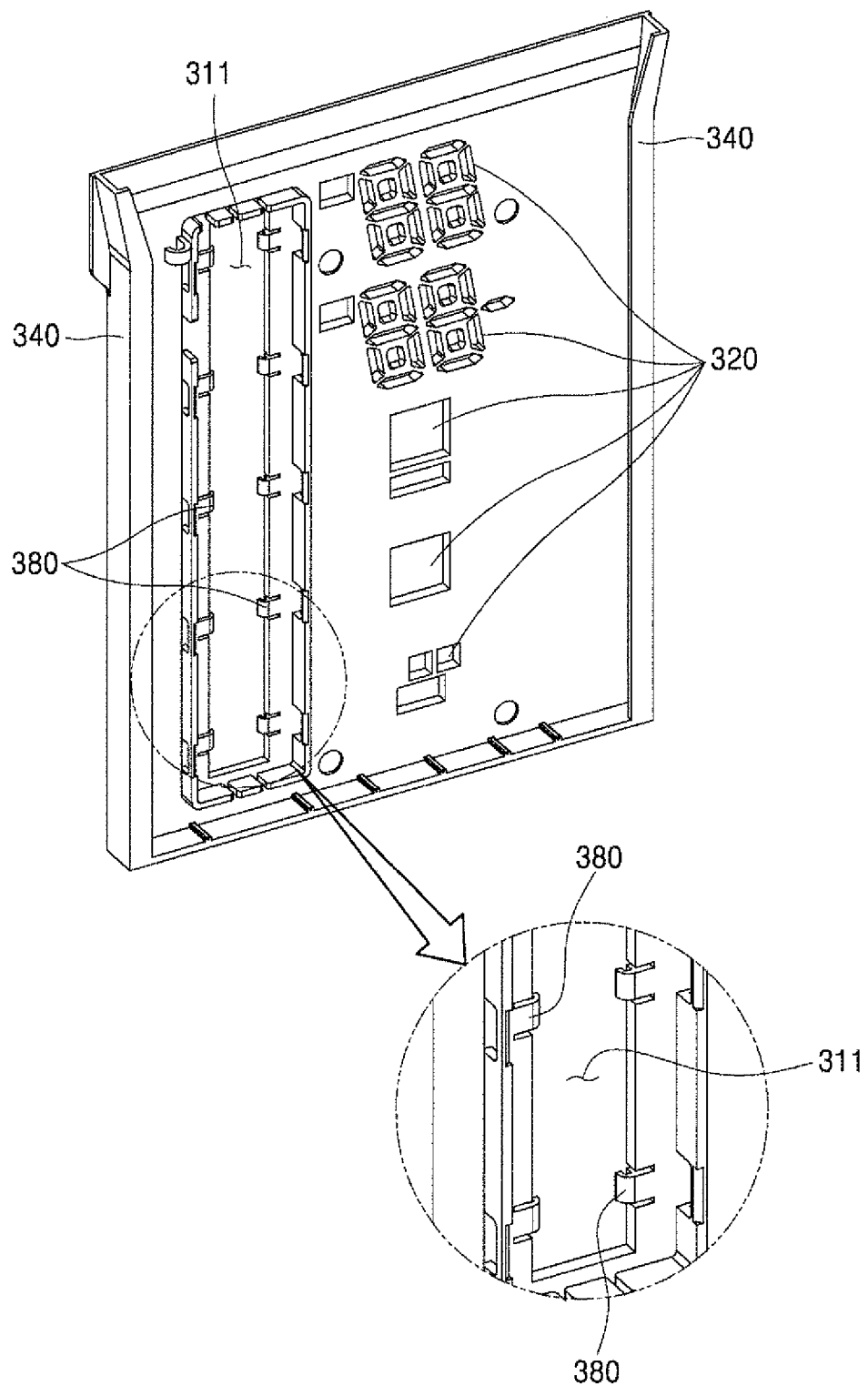
FIG. 29 is a perspective view illustrating the display cover in FIG. 26.
Figure 30:
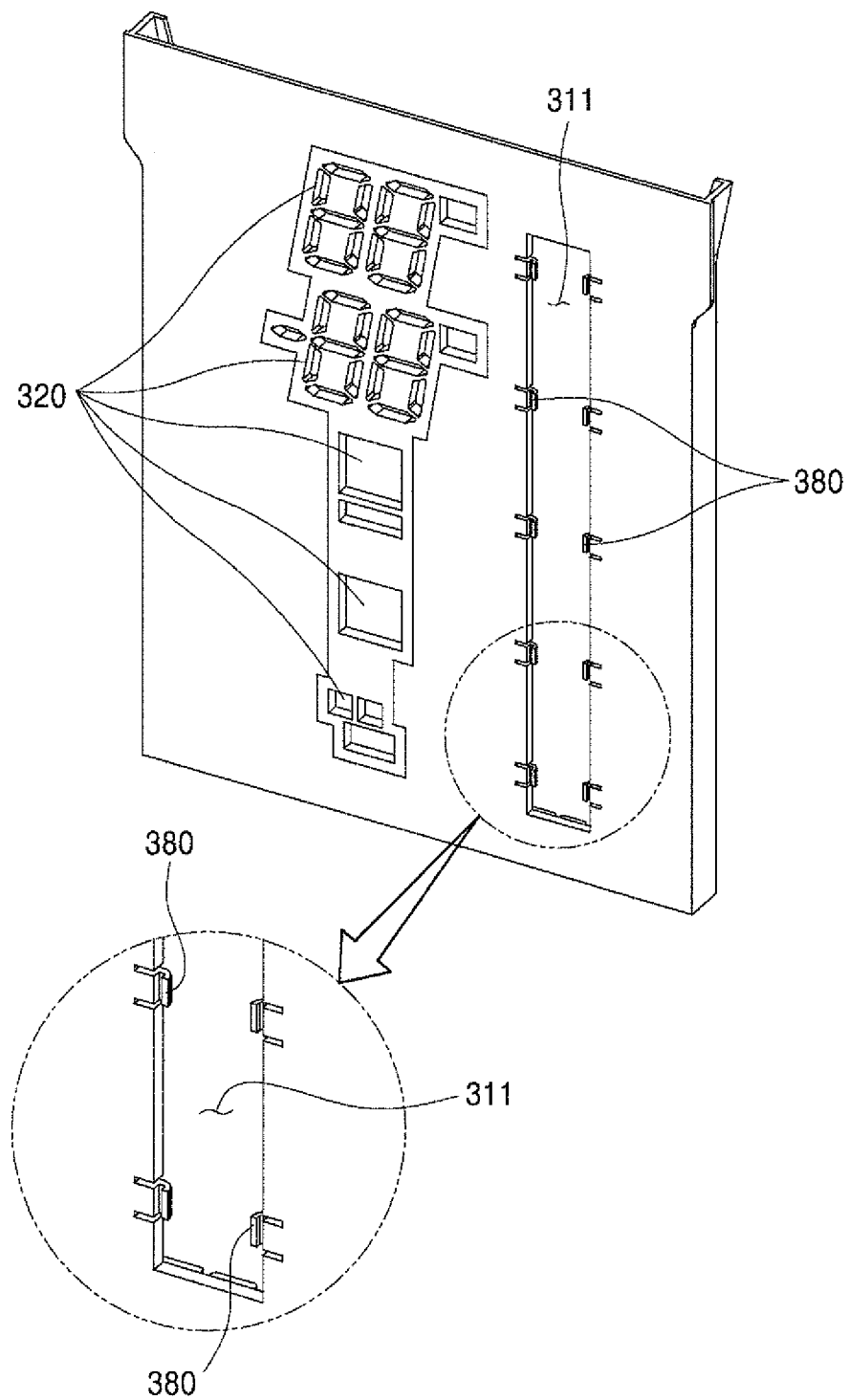
FIG. 30 is a perspective view illustrating the display cover in FIG. 29 from a different point.

An opening 267 for the wafer assembly 150 may also be formed in the cover 200-2. Referring to FIG. 28, the wafer assembly 150 may be exposed through the opening 267, and may not contact the cover 200-2. Unlike the above-described cover 200-1 in FIG. 12, the cover 200-2 may not be provided with a plurality of coupling hooks. FIG. 28 shows how the cover 200-2 may be attached to the touch substrate 120.

FIGS. 26 and 29-33 show a display cover 30-2. The display cover 30-2 may adhere to the rear surface of the front panel 20 and may support or press the above-described cover 200-2 in a forward direction. An accommodation portion or opening 311 and a hook structure in the display cover 30-2 may be different from those in the display cover 30-1 of FIG. 12, while a penetration hole 320 and a guide rail 340 in the display cover 30-2 may be the same as those in the display cover 30-1 of FIG. 12.

Like the display cover 30-1 in FIG. 12, the display cover 30-2 may include the accommodation portion or opening 311 that accommodates the cover 200-2 at sides of the front surface thereof. Unlike the display cover 30-1 in FIG. 12, the display cover 30-2 may not include a plurality of hook grooves in the accommodation portion 311 of the display cover 30-2 because the above-described cover 200-2 may not be provided with a plurality of coupling hooks. The cover 200-2 may further be secured to the display cover 30-2 by being pressed-fit or friction-fitted into the accommodation portion 311; thus, the cover 200-2 may be configured to have a shape corresponding to a shape of the accommodation portion 311.

A plurality of support hooks or clips 380 may have a different shape from the support hooks 318 in FIG. 19 provided in the display cover 30-1 and may be provided at side edges of the accommodation portion 311. The plurality of support hooks 380 may be provided in locations that face or align with each other on left and right sides of the accommodation portion 311 and may be spaced apart from each other by predetermined intervals in the up-down direction to evenly support the cover 200-2. The support hooks 380 may be bent or curved.

Figure 31:
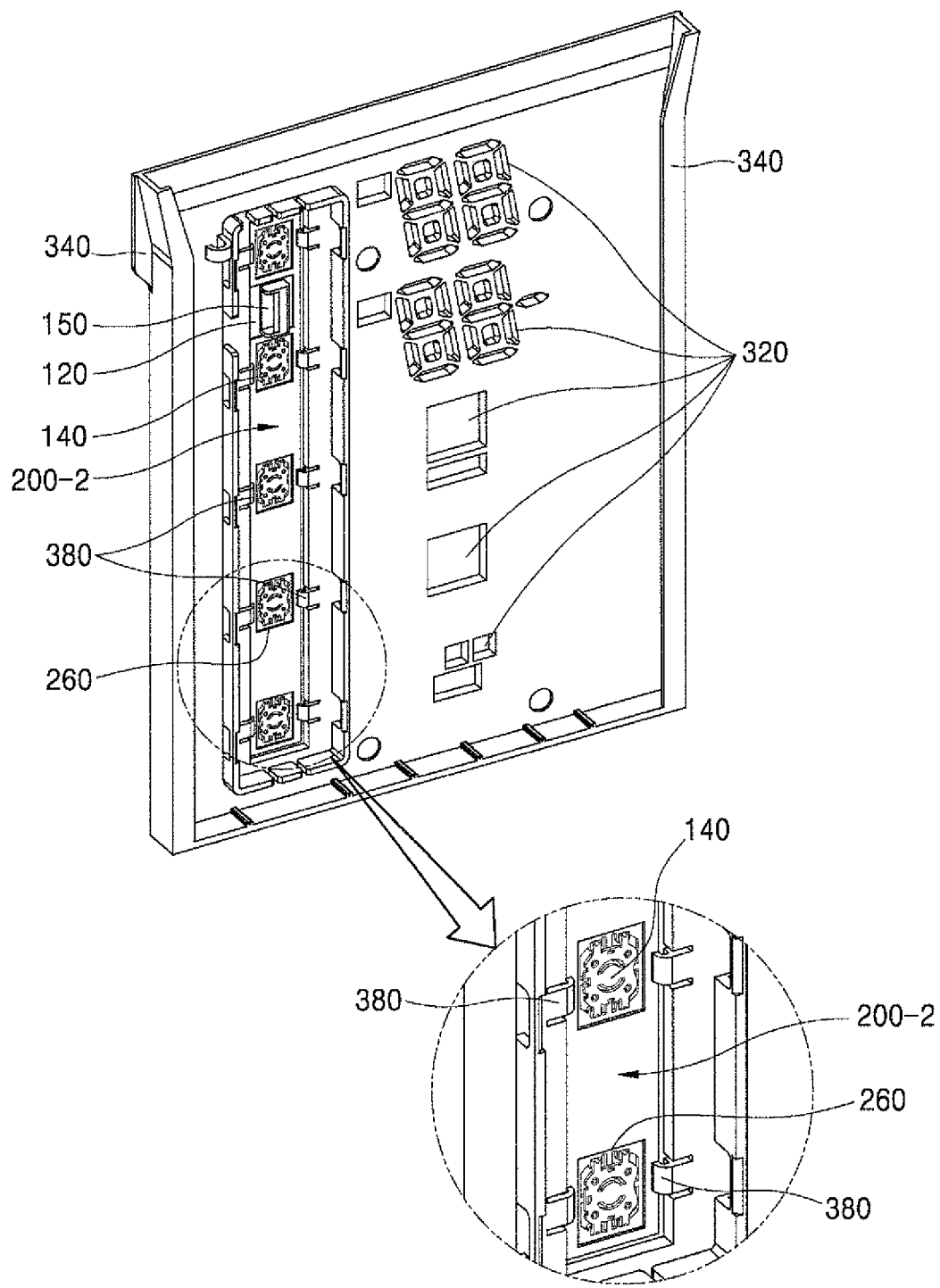
FIG. 31 is a perspective view illustrating the touch sensor assembly coupled with the display cover in FIG. 26.
Figure 32:
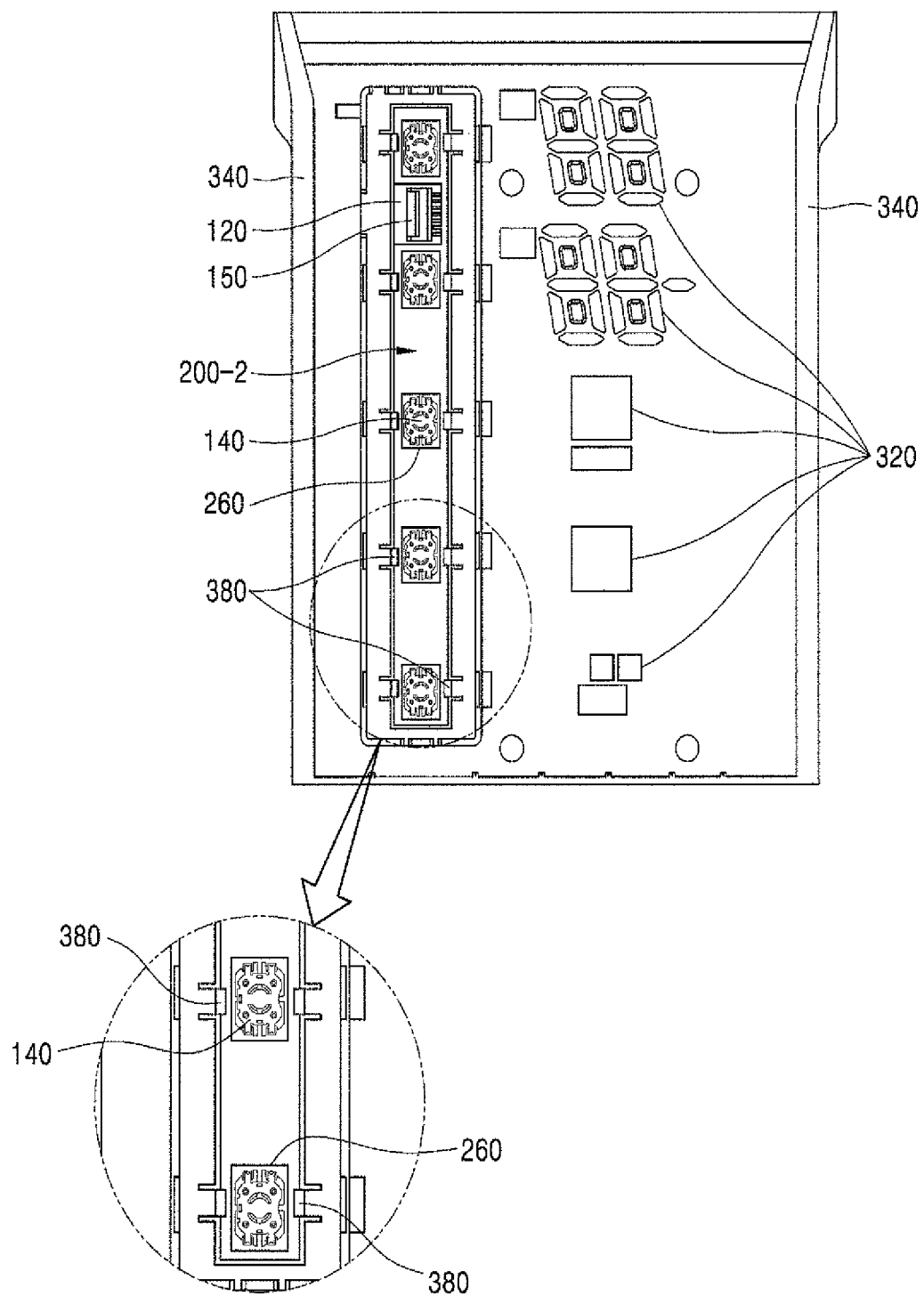
FIG. 32 is a rear view illustrating the touch sensor assembly coupled with the display cover in FIG. 31.
Figure 33:
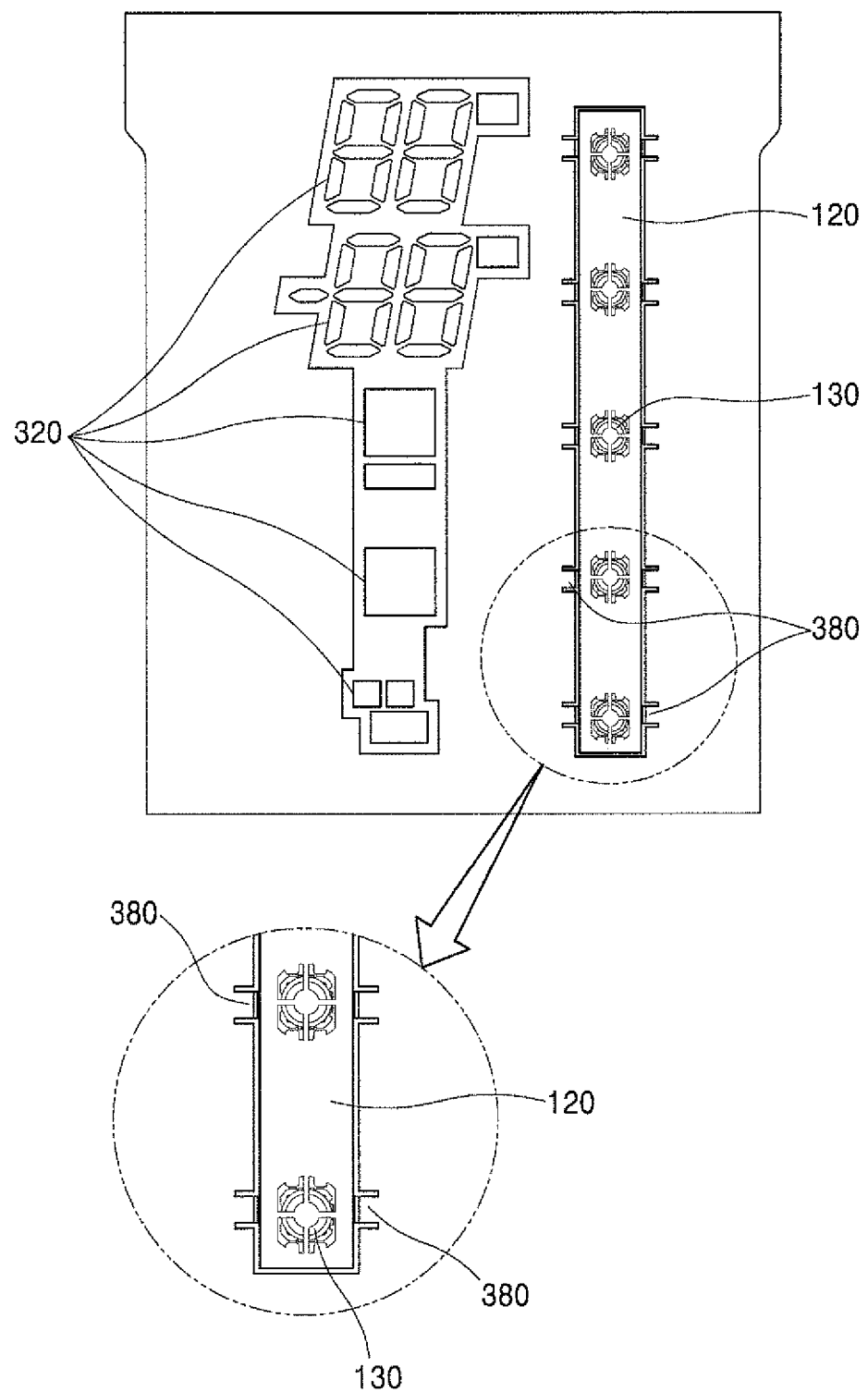
FIG. 33 is a front view illustrating the touch sensor assembly coupled with the display cover in FIG. 31.

As in FIGS. 31 and 32, bent ends of the plurality of support hooks 380 may hold or support the rear surface at lateral sides or edges of the cover 200-2 and push or support the cover 200-2 in a forward direction such that adhesion of the first and second adhesive members 110 and 190 may be maintained. The support hooks 380 may further be clips having first and second bent ends or ribs that secure the cover 200-2 from both front and rear surfaces. The first bent ends of the support hooks 380 may bend toward a front of the accommodation portion 311, while the second bent ends of the support hooks 380 may bend toward a rear of the accommodation portion. The cover 200-2 may thus be maintained in a groove formed between the first and second bent ends (behind the cover 200-2) and bent portions (in front of the cover 200-2).

The cover 200-2, along with the attached touch substrate 120, may be pressed-fit into the accommodation portion 311, while the bent ends of the support hooks 380 may maintain a position of the cover 200-2 such that the front surface of the touch substrate 120 remains flush with a front surface of the display cover 30-2. The display cover 30-2 with the above-described structure and features may firmly support the cover 200-2 and the attached touch substrate 120.

As described above, various examples of a touch sensor assembly (i.e., a cover structure) and a cover display (or display cover) may be applied to a refrigerator 1 according to exemplary embodiments. Embodiments disclosed herein may provide a structure of the touch sensor assembly and cover display and a method of manufacturing the same in relation to a refrigerator. However, the above-described touch sensor assembly and cover display may be applied to various products such as other home appliances, door panels for vehicles, etc.

Embodiments disclosed herein may provide a touch sensor assembly that may prevent oxidation of a piezo disc. The touch sensor assembly may prevent deformation or damage done to a piezo disc or a holder during compression with a device such as a roller. The touch sensor assembly may prevent an incorrect operation of a product (e.g., refrigerator), which is caused when a user mistakenly touches a touch sensor assembly.

Embodiments disclosed herein may provide a touch sensor assembly that includes an adhesive member which may prevent inflow of static electricity and which may maintain adhesive force for a long time. A touch substrate to which a piezo disc is attached and a cover display may integrally adhere to a panel. An adhesive member may have enhanced adhesion, thereby making it possible to improve credibility of long-lasting adhesion of the adhesive member.

Embodiments disclosed herein may provide a touch sensor assembly that may be highly sensitive to a touch, highly stable and durable, and/or may be freely designed. A refrigerator door may include the touch sensor assembly.

Objectives of the present disclosure are not limited to what has been described. Additionally, other objectives and advantages that have not been mentioned may be understood from the description and may be more clearly understood from implementations. Further, it will be understood that the objectives and advantages of the present disclosure may be realized via means and a combination thereof that are described in the appended claims.

Embodiments disclosed herein may provide a cover structure that adheres to the rear surface of a touch substrate to prevent oxidation of a piezo disc. The cover structure may be provided with a concave part which is concavely formed in a portion of the cover structure and which is overlapped with a holder in a direction opposite to a direction where the cover structure faces a touch substrate to prevent deformation or damage done to a metal touch sensor or a sensor holder during compression with a device such as a roller.

A touch sensor assembly may include a cover structure in which a portion of the front surface of the cover structure, which is not overlapped with a holder, adheres to the rear surface of a touch substrate to seal a piezo disc and a holder, and that is made of at least one of modified polyphenylene oxide (MPPO), polybutylene terephthalate (PBT), and polycarbonate (PC) to prevent an incorrect operation of a product, which may be caused when a user mistakenly touches the touch sensor assembly. The touch sensor assembly may further include an adhesive member to which an acrylic adhesive and primer are applied and which has 1MΩ or more of insulation resistance and resistance against heat of 149° C. to 204° C., may prevent inflow of static electricity and maintain adhesive force for a long time.

A touch sensor assembly may include a cover structure that is held respectively in a plurality of hook grooves formed in an accommodation part or opening of a cover display through a plurality of coupling hooks provided at both lateral ends of the cover structure and that is movable in the front-rear direction to integrally attach a touch substrate and the cover display to a front face panel. The cover structure may be supported forward by a plurality of support hooks provided in the accommodation part of the cover display to improve credibility of long-lasting adhesive force of the adhesive member. When the cover is held in the cover display and is movable in the front-rear direction with the above-described hook structure, the possibility that a stepped portion is created may be minimized, and tolerance that might happen during manufacture may be minimized or prevented.

A thin adhesive member may be applied to the touch sensor assembly to improve sensitivity to a touch. The touch sensor assembly may firmly adhere to a front face panel provided with a touch area via a hook structure that supports a cover structure to improve durability. Various types of piezo discs may be applied to the touch sensor assembly, and accordingly, a structure for fixing piezo discs may be easily modified such that the touch sensor assembly is freely designed. A refrigerator door may include the touch sensor assembly and a cover display that supports the touch sensor assembly forward.

Embodiments disclosed herein may provide a touch sensor assembly that may prevent oxidation of a piezo disc, thereby making it possible to prevent poor electrical contact caused by oxidation. A piezo disc or a holder may be prevented from being deformed or damaged during compression with a device such as a roller thereby making it possible to improve durability of the elements and extend their lifespan.

Embodiments disclosed herein may provide a touch sensor assembly that may prevent an incorrect operation of a product caused when a user mistakenly touches a touch sensor assembly, thereby making it possible to improve user convenience and user satisfaction. The touch sensor assembly may include an adhesive member which may prevent inflow of static electricity and which may maintain adhesive force for a long time, thereby making it possible to prevent damage done to circuit elements by static electricity and prevent an electric shock from occurring to the user.

Embodiments disclosed herein may provide a touch sensor assembly in which a touch substrate to which a piezo disc is attached, and may further provide a cover display integrally adhered to a front face panel, thereby improving productivity and/or manufacturing efficiently.

Embodiments disclosed herein may provide a touch sensor assembly in which credibility of long-lasting adhesive force of an adhesive member improves, thereby making it possible to minimize the possibility of reduced adhesion caused by vibration of a product, impact and a change in surrounding temperature and humidity, and the like. The touch sensor assembly may have enhanced sensitivity to a touch, thereby making it possible to improve user convenience and user satisfaction. The touch sensor assembly may firmly adhere to a front face panel, thereby making it possible to ensure enhanced durability and stable assembly and to improve credibility of sensitivity to a touch via stable assembly.

Embodiments disclosed herein may provide a touch sensor assembly that may be freely designed, thereby making it possible to design the touch sensor assembly in various ways. A refrigerator door may include the touch sensor assembly and a cover display which supports the touch sensor assembly forward.

Embodiments disclosed herein may be replaced, changed and modified in different ways by one having ordinary skill in the art to which the disclosure pertains without departing from the technical spirit of the disclosure. Thus, the disclosure should not be construed as being limited to the implementations and the attached drawings set forth herein.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch sensor assembly for a refrigerator, comprising:
    a substrate that is attached to a rear surface of a panel of the refrigerator and on which touch points are illuminated through a front surface of the panel;
    a plurality of piezo discs, each of the piezo discs having a first pole provided over a second pole, wherein the first pole is configured to contact the substrate;
    a plurality of holders that is configured to support the piezo discs and to fix the piezo discs to the substrate; and
    a cover that attaches to the substrate and that includes cavities which are concavely formed in a front of the cover to face the substrate and cover the holders,
    wherein lattices are formed in a rear of the cover, and the cavities and the lattices are alternatively provided on the cover such that each of the lattices is provided between an adjacent pair of the cavities and the lattices do not overlap with the cavities so as to reduce an amount of material used when forming the cover and to reduce bends in the cover when forming the cover, and
    wherein the cover is formed to protrude away from the substrate to ensure space for the cavities and the lattices.

2. The touch sensor assembly of claim 1, wherein the cover is made of at least one of modified polyphenylene oxide (MPPO), polybutylene terephthalate (PBT), and polycarbonate (PC).

3. The touch sensor assembly of claim 1, wherein a front of the cover is adhered to the substrate.

4. The touch sensor assembly of claim 1, wherein the cavities are configured to enclose the piezo discs and the holders, and a portion of a front surface of the cover not including the cavities adheres to the rear surface of the substrate to seal the piezo discs and the holders.

5. The touch sensor assembly of claim 1, wherein a first adhesive member adheres the front surface of the substrate to the surface of the panel, a second adhesive member adheres a front surface of the cover to the rear surface of the substrate, and an acrylic adhesive and primer are applied to at least one of the first and second adhesive members.

6. The touch sensor assembly of claim 5, wherein the second adhesive member includes a double-sided tape that has the same shape as a portion of the front surface of the cover which is not overlapped with the holders.

7. The touch sensor assembly of claim 5, wherein at least one of the first and second adhesive members has 1MΩ or more of insulation resistance, and at least one of the first and second adhesive members is resistant to heat between 149° C. to 204° C.

8. The touch sensor assembly of claim 1, wherein a plurality of coupling hooks extends along lateral sides of the cover in a front-rear direction that is parallel to a depth direction of the cavities.

9. The touch sensor assembly of claim 8, wherein the cover is supported by a display cover that is attached to the panel, an accommodation portion is formed in the display cover, and the plurality of coupling hooks are held respectively in a plurality of hook grooves that are formed along side edges of the accommodation portion and are configured to move in the front-rear direction.

10. The touch sensor assembly of claim 1, wherein the cover is supported by a display cover that is attached to the rear surface of the panel, an accommodation portion is formed in a side of a front surface of the display cover, and a plurality of support hooks that are provided on side edges of the accommodation portion are coupled to corresponding lateral sides of the cover to support the cover.

11. The touch sensor assembly of claim 1, further comprising:
    a plurality of press areas, each of the press areas being provided on the substrate and is configured to provide flexibility to the substrate, electrically connect with the first pole when contacting the first pole, and electrically connect with a first cable provided on the substrate; and
    a plurality of fixing surfaces, each of the fixing surfaces being configured to support the second pole such that each of the piezo discs is fixed onto the rear surface of the substrate, electrically connects with the second pole, and electrically connects with a second cable provided on the substrate.

12. The touch sensor assembly of claim 11, wherein at least one opening formed of at least one hole is formed in an area of the substrate corresponding to the touch points the press area is provided in a central portion of the opening, and at least one leg connects an outer edge of the opening to the press area such that the at least one hole is formed between the leg and the press area.

13. The touch sensor assembly of claim 11, wherein each of the holders includes:
    a rear support configured to support a rear of the piezo disc;
    a lateral support configured to extend from an edge of the rear support to the substrate and that is configured to support a lateral surface of the piezo disc; and
    at least one extension configured to extend from the lateral support outward in a direction parallel to the rear face of the touch substrate and fixed onto the fixing surface.

* * * * *